(12) United States Patent
Schweitzer, III et al.

(10) Patent No.: US 8,319,173 B2
(45) Date of Patent: Nov. 27, 2012

(54) ARC FLASH PROTECTION WITH SELF-TEST

(75) Inventors: Edmund O. Schweitzer, III, Pullman, WA (US); Veselin Skendzic, Pullman, WA (US); Gary W. Scheer, Pullman, WA (US); James R. Kesler, Pullman, WA (US); Douglas M. Trout, Lewiston, ID (US); Dhruba P. Das, Coatesville, PA (US)

(73) Assignee: Schweitzer Engineering Laboratories Inc, Pullman, WA (US)

( * ) Notice: Subject to any disclaimer, the term of this patent is extended or adjusted under 35 U.S.C. 154(b) by 573 days.

(21) Appl. No.: 12/562,834

(22) Filed: Sep. 18, 2009

(65) Prior Publication Data

US 2010/0072355 A1  Mar. 25, 2010

Related U.S. Application Data

(60) Provisional application No. 61/098,633, filed on Sep. 19, 2008.

(51) Int. Cl.
*G01D 18/00* (2006.01)
*G01J 1/02* (2006.01)

(52) U.S. Cl. ............... 250/227.11; 250/370.11

(58) Field of Classification Search .......... 250/372, 250/336, 200, 370.11, 227.11
See application file for complete search history.

(56) References Cited

U.S. PATENT DOCUMENTS

| | | | |
|---|---|---|---|
| 3,849,786 A | 11/1974 | Nanba | |
| 4,285,164 A | 8/1981 | Moore | |
| 4,369,364 A | 1/1983 | Kuntermann | |
| 4,418,338 A | 11/1983 | Burt | |
| 4,422,719 A | 12/1983 | Orcutt | |
| 4,516,022 A | 5/1985 | Lindgren | |
| 4,614,868 A | 9/1986 | Alster | |
| 4,702,553 A | 10/1987 | Buchmuller | |
| 4,791,518 A | 12/1988 | Fischer | |
| 4,978,863 A | 12/1990 | Lyons | |
| 5,170,050 A | 12/1992 | Giboulet | |
| 5,682,101 A | 10/1997 | Brooks | |
| 5,940,547 A | 8/1999 | Schumacher | |
| 6,011,480 A | 1/2000 | Schweitzer | |

(Continued)

FOREIGN PATENT DOCUMENTS

| | | |
|---|---|---|
| EP | 0818075 | 1/1998 |
| WO | 8808217 | 10/1988 |
| WO | 0221657 | 3/2002 |

OTHER PUBLICATIONS

IEEE 1584, Guide for Performing Arc Flash Hazard Calculations, Industry Applications Society, Sep. 23, 2002.

(Continued)

*Primary Examiner* — Tony Ko
(74) *Attorney, Agent, or Firm* — Stoel Rives LLP

(57) ABSTRACT

An method for automatically testing an arc flash detection system by periodically or continually transmitting electro-optical (EO) radiation through one or more transmission cables electro-optically coupled to respective EO radiation collectors. A test EO signal may pass through the EO radiation collector to be received by an EO sensor. An attenuation of the EO signal may be determined by comparing the intensity of the transmitted EO signal to an intensity of the received EO signal. A self-test failure may be detected if the attenuation exceeds a threshold. EO signals may be transmitted according to a particular pattern (e.g., a coded signal) to allow an arc flash detection system to distinguish the test EO radiation from EO radiation indicative of an arc flash event.

29 Claims, 9 Drawing Sheets

U.S. PATENT DOCUMENTS

| | | | |
|---|---|---|---|
| 6,124,706 | A | 9/2000 | Woods |
| 6,229,680 | B1 | 5/2001 | Shea |
| 6,292,105 | B1 | 9/2001 | Land |
| 6,433,976 | B1 | 8/2002 | Phillips |
| 6,476,396 | B1 | 11/2002 | Forsyth |
| 6,693,438 | B2 | 2/2004 | Shea |
| 6,920,028 | B2 | 7/2005 | Schweitzer |
| 7,035,068 | B2 | 4/2006 | Shea |
| 7,397,596 | B2 | 7/2008 | Yacoubian |
| 7,580,232 | B2 | 8/2009 | Caggiano |
| 7,791,846 | B2 | 9/2010 | Roscoe |
| 7,952,360 | B2 | 5/2011 | Ganesh |
| 2003/0205460 | A1 | 11/2003 | Buda |
| 2004/0054921 | A1 | 3/2004 | Land |
| 2004/0125532 | A1 | 7/2004 | Schweitzer |
| 2005/0203672 | A1 | 9/2005 | Restrepo |
| 2006/0261259 | A1 | 11/2006 | Beinhocker |
| 2007/0014060 | A1 | 1/2007 | Land |
| 2007/0070568 | A1 | 3/2007 | Potter |
| 2007/0108986 | A1 | 5/2007 | Moore |
| 2007/0132458 | A1 | 6/2007 | Allen, Jr. |
| 2007/0242402 | A1 | 10/2007 | Papallo |
| 2008/0004853 | A1 | 1/2008 | Radibratovic |
| 2008/0094612 | A1 | 4/2008 | Land |
| 2008/0170344 | A1 | 7/2008 | Byron |
| 2008/0239592 | A1 | 10/2008 | Roscoe |
| 2009/0161272 | A1 | 6/2009 | Asokan |
| 2009/0189615 | A1 | 7/2009 | Kinsel |
| 2010/0026425 | A1 | 2/2010 | Roscoe |

OTHER PUBLICATIONS

IEEE 1584a, IEEE Guide for Performing Arc-Flash Hazard Calculations—Amendment 1, IEEE Industry Applications Society, Nov. 29, 2004.

PCT/US2009/057531 Patent Cooperation Treaty, International Search Report and Written Opinion of the International Searching Authority, Nov. 19, 2009.

VAMP Arc Protection Series, VAMP 121, VAMP 221, Jun. 24, 2008.

UTU Arc Protection Systems—a possibility to be protected, Feb. 27, 2002.

George Roscoe, Marcelo E. Valdes, Ray Luna, Methdos for Arc-Flash Detection in Electrical Equipment, Petroleum and Chemical Industry Conference, 2010 Record of Conference Papers Industry Applications Society, Sep. 20-22, 2010.

PCT/US2009/057520 Patent Cooperation Treaty, International Search Report and Written Opinion of the International Searching Authority, Nov. 19, 2009.

PCT/US2009/057536 Patent Cooperation Treaty, International Search Report and Written Opinion of the International Searching Authority, Nov. 19, 2009.

PCT/US2009/057541 Patent Cooperation Treaty, International Search Report and Written Opinion of the International Searching Authority, Nov. 10, 2009.

PCT/US2009/057548 Patent Cooperation Treaty, International Search Report and Written Opinion of the International Searching Authority, Dec. 3, 2009.

Kevin Lippert, Donald M. Colaberardino, Clive W. Kimblin, Understanding IEEE 1584 Arc Flash Calculations, IEEE Industry Applications Magazine, May 2005.

ABB, Arc Protection Relay, Product Guide REA 10_, Jun. 22, 2005.

ABB, Arc Protection System REA, Jun. 2005.

Robert Wilson, Rainer Harju, Juha Keisala, Sethuraman Ganesan, Tripping with the Speed of Light: Arc Flash Protection, Mar. 27, 2007.

Meyle, LBW21 Arc Detection System Operating Instruction, Dec. 2004.

ARC FLASH PROTECTION WITH SELF-TEST

CROSS-REFERENCE TO RELATED APPLICATIONS

This application claims the benefit under 35 U.S.C §119(e) of U.S. Provisional Patent Application Ser. No. 61/098,633, entitled "Arc Flash Protection System with Self-Test," which was filed Sep. 19, 2008, and is hereby incorporated by reference in its entirety.

TECHNICAL FIELD

This disclosure relates to arc flash detection. More particularly, this disclosure relates to an arc flash detection device having a self-test capability.

DETAILED DESCRIPTION

Figure 1A:
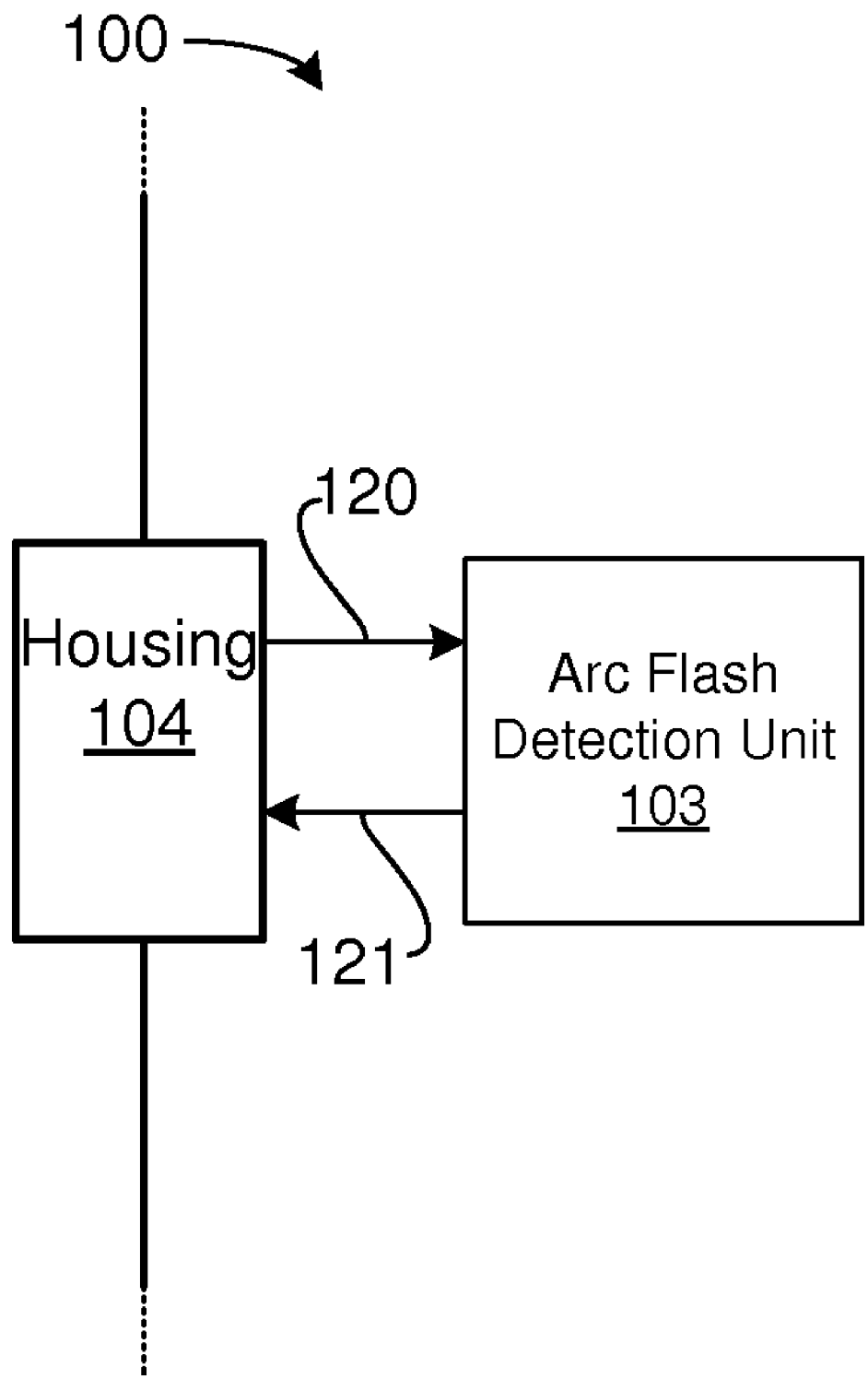
FIG. 1A is a diagram of a power system comprising an arc flash detection unit.

Arc flashes pose a serious risk to both personnel and equipment in the vicinity of a flash. An arc flash may produce intense electro-optical (EO) radiation (including visible light) in the area of the arc. In addition, an overcurrent condition may be created on electric conductor(s) that feed the arc.

As used herein, electro-optical (EO) radiation may refer to various frequencies and/or wavelengths of electromagnetic radiation (e.g., visible light). EO radiation as used herein may include a broad range of EO frequencies and/or wavelengths, including, but not limited to: radio, microwave, infrared (IR), visible, ultraviolet (UV), X-ray frequencies, and the like. An arc flash event may emit a subset of the possible frequencies and/or wavelengths of EO radiation (e.g., produce EO radiation within a particular spectrum). However, the various embodiments disclosed herein are not so limited, and may be adapted to detect and/or produce EO radiation at any frequency and/or wavelength, within any frequency and/or wavelength range, and/or within any frequency and/or wavelength spectrum.

An arc flash detection unit (AFDU) may be configured to monitor a portion of a power system (e.g., an enclosure, housing, or the like). The AFDU may be configured to detect an arc flash event based on stimulus received from the power system. The AFDU may make use of various different types of stimulus including, but not limited to: EO radiation detected in the vicinity of the power system, current levels within the power system, voltage levels at various points within the power system, heat, chemical detection, pressure differentials (e.g., sound), detection of particulates within an enclosure, or the like.

An arc flash protection system and/or apparatus comprising an AFDU may be configured to periodically and/or continually perform self-tests to validate the operation and/or configuration of various components. The self-tests disclosed herein may determine whether the AFDU and/or components of the AFDU are properly configured to detect an arc flash event.

The time required to detect an arc flash event by a protection system (e.g., an AFDU) may be used to determine a total time required to clear the arc flash (e.g., the total time required to clear the arc flash may be a sum of the time required to detect the flash plus the time required to trip protective elements responsive to the detection). The time required to clear the arc flash may be referred to as a "total arcing time," which may be used to calculate the incident energy released by the arc flash event (given the arc current, resistance, conductor gap, and the like). The detection time of an arc flash protection system may vary depending upon the configuration of the protection system (e.g., the sensitivity of the system). System sensitivity may be selected to provide a balance between providing adequate arc flash protection and preventing misoperation (e.g., detecting false positives).

The "Guide for Performing Arc Flash Hazard Calculations," which is promulgated by the Institute of Electrical and Electronics Engineers (IEEE) as IEEE 1584, provides several means for calculating arc flash incident energy, one of which is provided below in Equation 1:

$$\mathrm{Log}(E_N) = K_1 + K_2 + 1.0811 \cdot \mathrm{Log}(I_a) + 0.0011 \cdot G \qquad \text{Eq. 1}$$

In Equation 1, $E_N$ is the arc flash incident energy, $K_1$ is a switchgear-dependent constant value (depending upon whether the switchgear is in an open or box configuration), $K_2$ is a constant (0 for ungrounded or high-resistance grounded switchgear and −0.113 for grounded systems), $I_a$ is the maximum arcing current, and G is a gap between conductors within the switchgear.

The IEEE 1584 standard further provides means for determining an arc-protection boundary as follows:

$$D_b = \left[ 4.184 \cdot C_f \cdot E_n \cdot \left( \frac{t}{0.2} \right) \cdot \left( \frac{610^x}{E_b} \right) \right]^{\frac{1}{x}} \qquad \text{Eq. 2}$$

In Equation 2, $D_b$ is the distance of the boundary from the arcing point, $C_f$ is a voltage constant (1.0 for voltages above 1 kV), $E_n$ is the normalized arc flash incident energy (e.g., calculated per Equation 1 above), $E_b$ is the incident energy at the boundary (5.0 J/cm² for bare skin), and x is a distance exponent constant (0.973 for 5 kV switchgear).

The protection boundary may determine where maintenance personnel may safely work in relation to the switchgear and/or may determine what, if any, protective gear should be used by the personnel.

Other standards exist for calculating arc flash energy to determine appropriate proximity and/or protective gear requirements. For instance, the National Fire Protection Association (NFPA) provides for the calculation of an arc thermal performance value (ATPV), which is similar to the IEEE 1584 arc flash incident energy. The ATPV may determine a proximity boundary in which maintenance personnel may safely work. In addition, the ATPV and proximity boundary may indicate the nature of the protective gear that should be used by personnel. Other arc flash safety-related standards are provided by the National Electric Code (NEC) and Occupational Safety and Health Administration (OSHA).

According to various embodiments, a system capable of self-validation or self-testing is configured to monitor and protect switchgear. The monitoring and protection functions may be temporarily disabled during the self-test. Alternatively, a self-test may be performed periodically or even continuously while the system continues to monitor and protect the switchgear.

The self-test systems and methods described herein may be configured or adapted for use with any number of arc flash protection devices. Several embodiments are illustrated and described herein for understanding and clarity. However, it will be apparent that these embodiments may be adapted for use with various alternative systems. Additionally, existing power systems monitoring and/or protection systems may be adapted to use the self-test methods described.

In some embodiments, an EO radiation collector may be configured for use with any number of monitoring devices capable of receiving and interpreting EO signals. In addition, existing monitoring devices, or intelligent electrical devices (IED), may be configured or reconfigured to send EO signals through existing or newly installed EO radiation collectors for testing, validation, and installation. Accordingly, the self-test methods disclosed herein may be used with the exemplary system described herein, or with existing arc flash detection systems that may or may not need modification.

According to some embodiments, an arc flash protection system (AFPS) capable of performing self-tests comprises: EO radiation collector(s), EO conductor cable(s), an EO radiation collector, and an EO emitter. The EO radiation collectors may be configured to collect and/or transmit EO radiation produced during an arc flash to an IED or other monitoring device. The EO radiation collectors described herein may be used with any of a variety of IEDs or monitoring devices capable of receiving and interpreting EO signals.

According to some embodiments, an EO radiation collector may include a cap and/or base portion configured to securely receive ends of one or more EO conductor cables. As used herein, an EO conductor cable may refer to any material capable of conducting (e.g., receiving and/or transmitting) EO radiation. An example of an EO conductor is a fiber optic cable, although the disclosure is not limited in this regard. The cap of the EO radiation collector may be configured to gather EO radiation and to direct a portion of the EO radiation to the EO conductor cables secured therein. The cap may include lenses, diffusers, translucent or transparent materials, and/or other elements to facilitate in collecting and/or directing EO radiation to the EO conductor cables therein. Additionally, the housing may serve to direct EO radiation emitted from a first conductor within the housing to a second EO conductor cable within the housing.

In some embodiments, the longitudinal axes of the ends of the EO conductor cables within the housing may be parallel and pointed in the same direction, parallel and pointed at each other, or at an angle (non-parallel). The longitudinal axes of the EO conductor cables may be oriented such that a portion of EO radiation emitted from a first one of the EO conductor cables is received by a second one of the EO conductor cables. Accordingly, the EO radiation collector may be configured to provide an EO transmission path between the first EO conductor cable and the second EO conductor cable. The housing may be configured to provide a portion of the EO transmission path between the EO conductor cables; EO radiation emitted from the first EO conductor cable may be reflected, refracted, diffused, or the like, within the EO radiation collector to be received by the second EO conductor cable.

Two or more EO radiation collectors may be daisy-chained together, such that EO radiation received by a first EO radiation collector may be transmitted to a second EO radiation collector, and so on. For example, an EO conductor cable may provide EO communication between a first EO radiation collector and a second EO radiation collector. A first end of the EO conductor cable may be received within a housing of the first EO radiation collector, and a second end of the EO conductor cable may be received within a housing of the second EO radiation collector. Accordingly, EO radiation received by the first EO radiation collector may be transmitted through the EO conductor cable to the second EO radiation collector, and vice versa. Any number of EO radiation collectors may be daisy-chained according to the teachings of this disclosure. In addition to daisy chaining, other connections between EO radiation collectors may be provided. For example, a first EO radiation collector may be electro-optically coupled to multiple EO radiation collectors via respective EO conductor cables (e.g., coupled to a second EO radiation collector and a third EO radiation collector).

A self-test operation may include transmitting EO radiation to an EO radiation collector (e.g., via an EO conductor cable coupled thereto), and detecting EO radiation from the collector responsive to the transmission. The transmission may comprise a "test pulse" of EO radiation. EO radiation may be detected responsive to the test pulse. If the detected EO radiation is above a threshold intensity level, the EO radiation collectors may be validated. If EO radiation is not received (or is below a threshold intensity level), an EO radiation collector fault may be detected. One or more actions may be taken responsive to detecting an EO radiation collector fault including, but not limited to: asserting an alarm, issuing one or more alerts (e.g., to other monitoring components, human operators, or the like), displaying an indication of the failure on a human-machine interface (HMI), such as a display, tripping one or more protecting devices (e.g., breakers), or the like.

In some embodiments, the test pulse may be configured to be distinguishable from EO radiation typically produced during an arc-flash event. Accordingly, a self-test operation may be performed while the EO radiation collectors are simultaneously being used to detect arc flash EO radiation. For example, a wavelength of the test pulse may be readily distinguishable from the wavelength of EO radiation produced in an arc flash. Alternatively, or in addition, the test pulse may comprise a pattern of test pulses. The pattern may be readily distinguishable from EO radiation produced in an arc flash event and/or ambient EO radiation (e.g., ambient light). In some embodiments, the pattern may be a coded waveform. The coded waveform may be a low-correlation sequence of test pulses. The coded waveform may be adapted to reduce cross-talk between different groups of EO radiation collectors (e.g., prevent a test pulse of EO radiation received by a first EO radiation collector from being received by a second EO radiation collector). The test pulse may be configured to decrease EO radiation collector cross-talk and/or interference using, inter alia, a spread spectrum modulation technique, which may include, but is not limited to: random binary sequences, finite length pseudo random binary sequences, Gold codes, Barker codes, low autocorrelation/crosscorrelation signals, or the like.

As discussed above, an EO radiation collector may house one or more EO conductor cables through which a test pulse may be received. The EO radiation collector may be configured to emit a portion of the EO radiation received via the one or more EO conductor cables. Accordingly, a test pulse that comprises EO radiation in the human-visible range, may cause the EO radiation collector to "light up" during a self-test (e.g., emit EO radiation in the human-visible range). Accordingly, a technician (or other personnel) in the vicinity of the EO radiation collector may visually confirm whether the EO radiation collector has received a test pulse.

FIG. 1A shows one embodiment of an AFDU 103 in an electrical power system 100. The AFDU 103 may be communicatively coupled to portions of the power system 100 to receive stimulus 120 therefrom. As will be discussed below, the AFDU 103 may be configured to detect an arc flash event occurring within the power system 100 (e.g., within a housing 104) based on the stimulus 120 received from the power system 100 (e.g., current measurements, EO radiation measurements, etc.).

In some embodiments, the AFDU 103 may be communicatively coupled to one or more current transformers, or other measurement devices, configured to provide the AFDU 103 with stimulus 120 comprising current measurements from various points within the power system 100 (e.g., on either side of a housing 104 in the electrical power system 100). The housing 104 may include components that may be susceptible to arc flash events (e.g., switchgear, circuit breakers, and the like).

The AFDU 103 may be configured to receive other types of stimulus 120, such as measurements of EO radiation detected by one or more EO radiation collectors disposed within the vicinity of the power system 100. The EO radiation collectors may be disposed within the housing 104 and/or may be positioned to capture EO radiation produced by an arc flash event. In some embodiments, the EO radiation collectors may be positioned within a switchgear enclosure 105 within the housing 104.

Although particular types of stimulus 120 are discussed herein (e.g., current and EO stimulus), the AFDU 103 could be configured to detect an arc flash event based on any number of different types of stimulus 120. Therefore, this disclosure should not be read as limited in this regard.

The AFDU 103 may be configured to invoke certain protective functions upon detecting an arc flash event. The protective function may be invoked via a communications interface 121 with the power system 100 (e.g., with power system components within the housing 104). For example, the AFDU 103 may trigger a circuit breaker, a switch, or other equipment to remove an arcing circuit from power and/or isolate the circuit from the rest of the power system 100. Alternatively, or in addition, the AFDU 103 may produce an alarm signal that may be received by another protective system (e.g., a protective relay, an IED, or the like), which may be configured to take one or more protective actions responsive to the alarm. The alarm may be transmitted to other remote devices and/or may be made available for display on a human-machine interface (HMI). These protective actions may reduce the amount of energy released by the arc flash event and/or may alert other systems and/or personnel to the arc flash event.

Figure 1B:
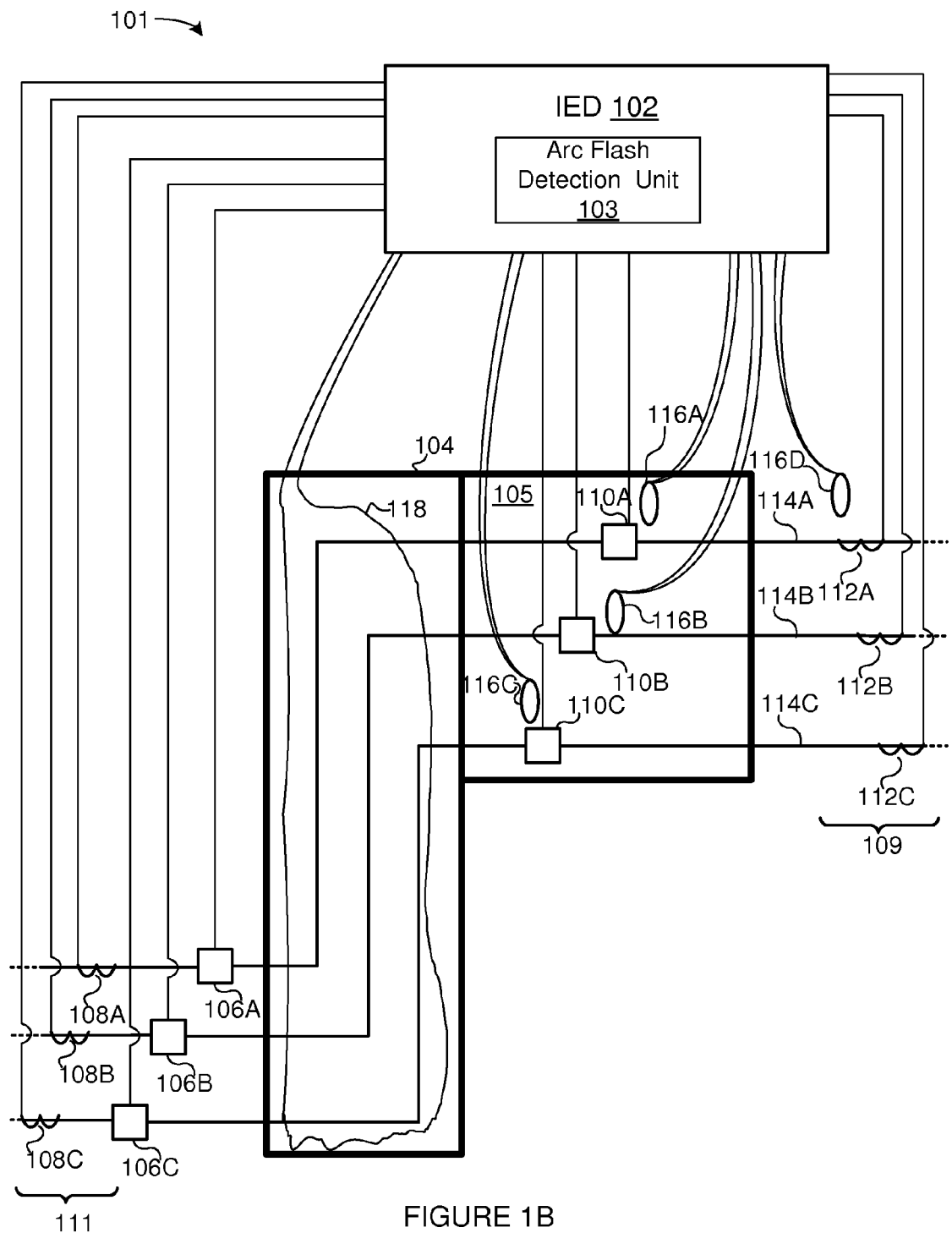
FIG. 1B is a diagram of a power system comprising an intelligent electronic device and an arc flash detection unit.

FIG. 1B shows an electrical power system 101 that includes an intelligent electronic device (IED) 102 comprising an AFDU 103. The IED 102 may provide various monitoring and protection services to the power system 101, including electrical power system components within a housing 104.

As used herein, an IED (such as the IED 102 of FIG. 1) may refer to any one or combination of: a CPU-based relay and/or protective relay, a digital fault recorder, a phasor measurement unit (PMU), a phasor measurement and control unit (PMCU), a phasor data concentrator (PDC), a wide area control system (WACS), a relay with phasor measurement capabilities, a wide area protection system (WAPS), a Supervisory Control and Data Acquisition (SCADA) system, a Programmable Automation Controller (PAC), a Programmable Logic Controller (PLC), a dedicated arc flash protection controller (e.g., an AFDU), a system integrity protection scheme, or any other device capable of monitoring and/or protecting an electrical power system. Accordingly, the IED 102 may comprise one or more processors, memories, computer-readable storage media, communications interfaces, HMI components, and the like. In the FIG. 1B embodiment, the IED 102 may be a protective relay, such as the SEL 751 manufactured by and available from Schweitzer Engineering Laboratories, Inc. of Pullman, Wash.

As shown in FIG. 1B, the AFDU 103 may be implemented within the IED 102 (e.g., as a component of the IED 102). The AFDU 103 may be implemented as machine-readable and/or machine-interpretable instructions stored on a computer-readable storage media of the IED 102. Alternatively, or in addition, the AFDU 103 may comprise one or more hardware components. In some embodiments, the AFDU 103 (or portions thereof) may be implemented independently of an IED 102 (e.g., the AFDU 103 may comprise its own independent processing resources, communications interfaces, etc.).

The IED 102 and/or AFDU 103 may be configured to monitor power system equipment disposed within the housing 104. The housing 104 may comprise a switchgear cabinet, a sealed enclosure, or any other housing type. The housing 104 may enclose switchgear equipment, such as circuit breakers 110A, 110B, and/or 110C, and the like.

The AFDU 103 may receive various types of stimulus 120 from the power system 101. The stimulus 120 may be received directly (e.g., by sensors coupled to the AFDU 103) and/or indirectly through another device, such as the IED 102. In the FIG. 1B example, the AFDU 103 is configured to receive current stimulus (current measurements obtained by current transformers) and EO stimulus (EO radiation captured by EO radiation collectors). The AFDU 103 may be configured to detect an arc flash event based on the current and EO stimulus 120. However, in alternative embodiments, the AFDU 103 may be configured to detect arc flash events using other stimulus types (e.g., EO radiation and/or current measurements alone, heat, pressure, chemical emissions, etc.).

The AFDU 103 may be configured to monitor a three-phase power signal comprising three conductors 114A, 114B, and 114C, each of which may run through the housing 104 (one for each phase of the three-phase power signal). For instance, the conductor 114A may carry an "A phase" electrical power signal, the conductor 114B may carry a "B phase" electrical power signal, and the conductor 114C may carry a "C phase" electrical power signal. Although a three-phase power signal is referred to herein, one skilled in the art will recognize that the teachings of this disclosure could be applied to power systems comprising any type and/or number of power signals, and, as such, the teachings of the disclosure should not be read as limited in this regard.

In the FIG. 1B example, the AFDU 103 receives current measurements from current transformers (CTs) communicatively and/or electrically coupled to the conductors 114A, 114B, and/or 114C; CTs 112A, 112B, and 112C are coupled to the conductors 114A, 114B, and 114C at a first location 109, and CTs 108A, 108B, and 108C are coupled to the conductors 114A, 114B, and 114C at a second location 111 (e.g., on an opposite end of the housing 104).

The AFDU 103 is communicatively coupled to EO radiation collectors 116A, 116B, 116C, 116D, and 118, which may be configured to detect EO radiation emitted within the vicinity of the housing 104. As used herein, an EO radiation collector, such as the EO radiation point collectors 116A, 116B, 116C and 116D and/or the loop EO radiation collector 118, may be configured to capture various types of EO radiation, including visible EO radiation (e.g., visible light), infra-red (IR) radiation, ultra-violet (UV) radiation, and/or EO radiation at other wavelengths. Moreover, as used herein, light or a "light event" may refer to EO radiation that comprises EO energy at many different wavelengths, some of which may be visible to the human eye and some of which may not. Therefore, this disclosure should not be read as limited to detection and/or processing of only EO radiation visible to humans, but should be read as encompassing any type of EO radiation known in the art.

The EO radiation collectors 116A, 116B, 116C, 116D, and 118 may be distributed within the housing 104 and may be communicatively and/or electro-optically coupled to the IED 102 and/or AFDU 103. In some embodiments, the collectors 116A, 116B, 116C, and/or 116D may be "point collectors," comprising fiber-optic leads (or other EO conductive material) configured to selectively detect EO radiation within the housing 104 (e.g., detect EO radiation at particular points and/or locations within the housing 104). The point collectors 116A, 116B, 116C, and/or 116D may be placed and/or positioned within the housing 104 so as to be capable of collecting and/or transmitting EO radiation produced by an arc flash event therein (e.g., in the vicinity of the switchgear components, such as the circuit breakers 110A, 110B, and/or 110C, a breaker trunk compartment (not shown), or the like). For example, the point collectors 116A, 116B, 116C, and/or 116D may be positioned to have a line-of-sight and/or an electro-optical path to respective breakers 110A, 110B, and/or 110C (e.g., to avoid "shadows" or other obscuring structures within the housing 104). In some embodiments, the point collectors 116A, 116B, 116C, and/or 116D may be optically coupled to additional optical elements (not shown), such as mirrors, fiber-optic leads, lenses, EO conductive materials, or the like, which may be configured to direct EO radiation produced within the housing 104 and/or in the vicinity of the switchgear components (e.g., breakers 110A, 110B, and/or 110C) to one or more of the collectors 116A, 116B, 116C, and/or 116D.

The collectors 116A, 116B, 116C, and/or 116D may comprise EO conductive materials, such as fiber-optic filaments, capable of collecting EO radiation and transmitting a portion thereof to the IED 102 and/or AFDU 103. Alternatively, or in addition, the collectors 116A, 116B, 116C, and/or 116D may be capable of collecting EO radiation and transmitting an electrical signal and/or other indicator of the detected EO radiation to the IED 102 and/or AFDU 103 (e.g., via a communication network or the like).

The AFDU 103 may be coupled to other devices capable of collecting and/or transmitting EO radiation, such as the loop EO radiation collector 118, which may extend through a portion of the housing 104. The loop EO radiation collector 118 may comprise one or more sheathed fiber-optic cables (or other EO conductive material), wherein portions of the cable are exposed (e.g., portions of sheathing around the EO conductive material are removed). The loop EO radiation collector 118 may be configured to receive EO radiation through these exposed portions. The EO radiation so received may be transmitted to the IED 102 and/or AFDU 103. Alternatively, or in addition, the loop EO radiation collector 118 may comprise a dedicated EO radiation collector (not shown), which may transmit an electrical signal or other indicator of the EO radiation detected thereby (e.g., via a communication network or the like).

Although FIG. 1B depicts the AFDU 103 receiving EO stimulus from a particular set of EO radiation collectors 116A, 116B, 116C, 116D, and 118, one skilled in the art will recognize that the teachings of this disclosure could be applied to any number and/or type of EO radiation collectors, including, but not limited to: optical lenses, waveguides, concentrators, and the like. Therefore, this disclosure should not be read as limited to any particular number, type, and/or arrangement of EO radiation collectors. Moreover, although a particular housing 104 is depicted, the disclosure is not limited in this regard; the teachings of this disclosure could be applied to any housing known in the art including, but not limited to: a breaker box, switch box, busbar enclosure, duct, conduit, or other enclosure or housing type.

The AFDU 103 may be configured to detect an arc flash event based on inter alia stimulus received from the CTs 108A, 108B, 108C, 112A, 112B, and 112C and/or EO radiation collectors 116A, 116B, 116C, 116D, and 118. High levels of EO radiation and/or high current levels may be indicative of an arc flash event occurring within the housing 104. Responsive to the AFDU 103 detecting an arc flash event, the IED 102 may be configured to take one or more protective actions, such as tripping one or more circuit breakers (e.g., breakers 106A, 106B, and/or 106C), removing one or more of the conductors 114A, 114B, and/or 114C from power, transmitting one or more alarm signals to external devices, displaying an alarm on an HMI, or the like.

For example, the IED 102 may be communicatively coupled to the circuit breakers 106A, 106B, 106C via a communication network (e.g., over an Ethernet network, a SCADA network, an IEEE C37.118 network, a wireless network, or the like). Responsive to the AFDU 103 detecting an arc flash event on one or more of the conductors 114A, 114B, and/or 114C, the IED 102 may be configured to interrupt the power flow thereon.

Figure 2:
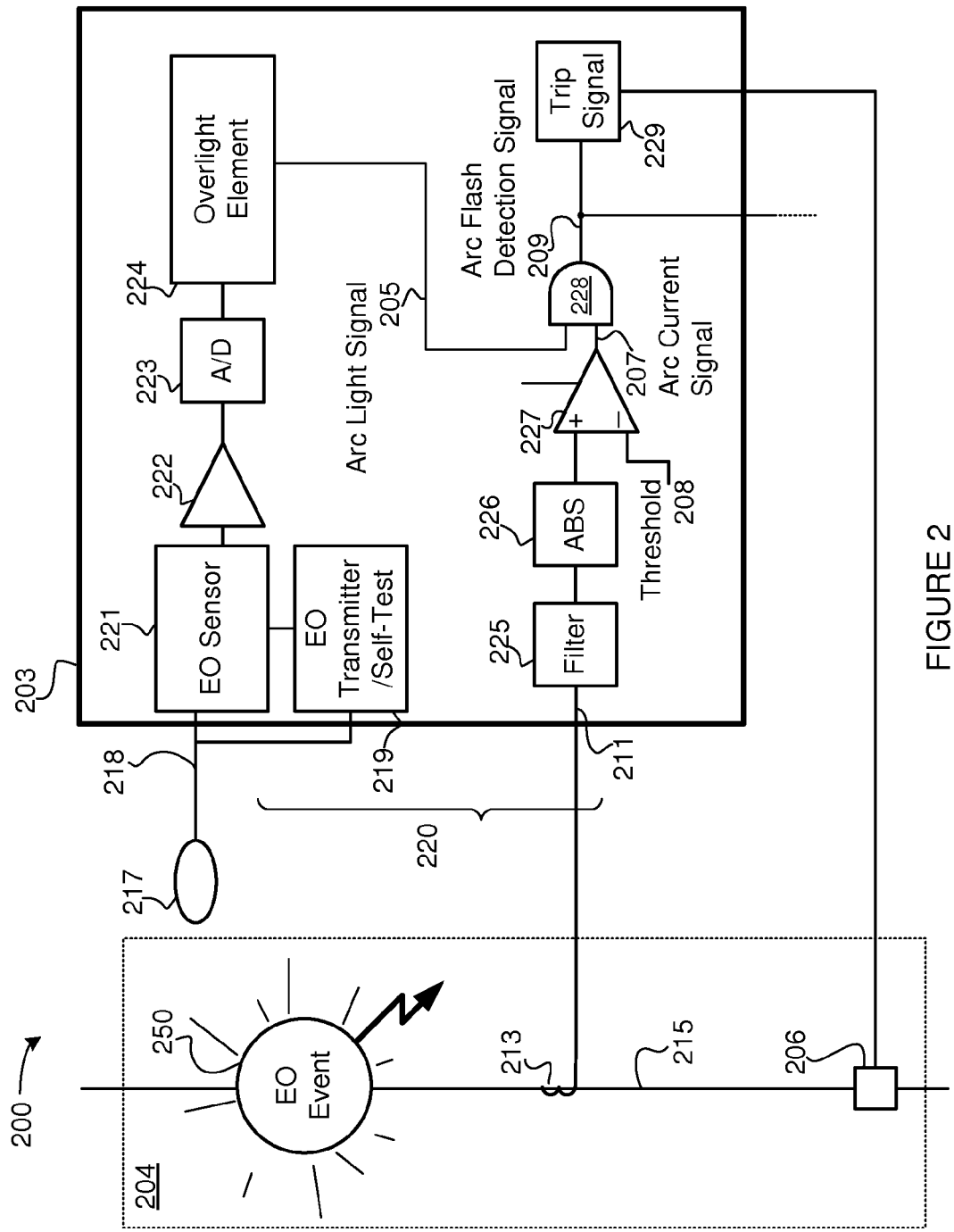
FIG. 2 is a block diagram of one embodiment of an arc flash detection unit.

FIG. 2 is one embodiment of an arc flash detection unit (AFDU), such as the AFDU 103 and/or IED 102 described above in FIGS. 1A and 1B. An electrical power system 200 may be protected by an AFDU 203, which, as discussed above may be implemented independently and/or in conjunction with an IED (not shown); the AFDU 203 may be part of an IED, such as IED 102 depicted in FIG. 1, and/or may be an independent device (e.g., add-on device), which may be communicatively coupled to an IED.

In the FIG. 2 embodiment, the AFDU 203 may monitor a portion of an electrical power system 200, which may comprise a conductor 215 and a circuit breaker 206. The AFDU 203 may receive various types of stimulus 220 from the electrical power system 200. In the FIG. 2 example, the AFDU 203 receives current and EO radiation stimulus 220 via respective measurement devices 213 and 217. A CT 213 may be coupled to the conductor 215 to measure a current flowing thereon. The CT 213 may be communicatively coupled to an input 211 of the AFDU 203 to provide current measurement stimulus thereto. An EO radiation collector 217 may be placed in proximity to the conductor 215 and/or within a housing 204 through which the conductor 215 passes. The EO radiation collector 217 may comprise a point-source EO radiation collector, a loop EO radiation collector, or any other device capable of collecting and/or transmitting EO radiation.

An arc flash event occurring in the vicinity of the conductor 215 (e.g., between the conductor 215 and ground, another conductor, a switch (not shown), on a circuit breaker (not shown), or the like), may produce an EO event 250. The EO event 250 caused by the arc flash may cause EO radiation to be emitted, which may be detected by the EO radiation collector 217. As discussed above, the EO event 250 may produce EO radiation at various frequencies and/or wavelengths, some of which may be visible to a human. The EO radiation collector 217 may be electro-optically coupled to the AFDU 203 to transmit a portion of the EO radiation emitted by the EO event 250 and detected by the collector 217 to the EO sensor 221 of the AFDU 203.

The EO sensor 221 may be configured to convert EO radiation received from the EO radiation collector 217 into a signal indicative of the EO radiation (e.g., an electrical signal). Accordingly, the EO sensor 221 may comprise a photodiode (such as a silicon photodiode), a photo resistor, Charge-Coupled Device (CCD) detector, an IR detector, a complementary metal-oxide-semiconductor (CMOS) device, or any other device or structure capable of converting EO radiation into an electrical signal.

In some embodiments, the signal produced by the EO sensor 221 may be amplified by an amplifier 222 and sampled (e.g., converted into a discrete, digital value) by an A/D converter 223. The amplifier 222 may comprise a fixed or variable gain amplifier. In alternative embodiments, the amplifier 222 may be omitted. In embodiments implemented using analog circuitry, the A/D converter 223 may be omitted.

Although FIG. 2 shows the EO sensor 221, amplifier 222, and A/D converter 223 as part of the AFDU 203, one skilled in the art will recognize that these components could be disposed in proximity to the EO radiation collector 217. In this alternative embodiment, the EO radiation collector 217 may be configured to generate a signal indicative of the EO radiation collected thereby (e.g., as a sampled, discrete measurement) using a local EO sensor, amplifier, and/or A/D converter (not shown), and could communicate the measurement(s) to the AFDU 203 via a communication network (not shown) or the like.

The AFDU 203 includes an overlight element 224, which may produce an arc light signal 205 based on the EO measurements received via the EO sensor. Assertion of the arc light signal 205 may indicate that the AFDU 203 has detected EO radiation indicative of an arc flash event.

In some embodiments, the overlight element 224 may compare the sampled, discrete EO radiation measurements produced by the A/D converter 223 to an overlight threshold value. The overlight threshold value may represent an EO radiation level that is indicative of an arc flash event (e.g., as opposed to changes in ambient light conditions or the like). The arc light signal 205 may be asserted if the EO radiation level exceeds the threshold. The threshold may be adapted according to a desired sensitivity level of the AFDU 203.

The overlight element 224 may implement other comparison techniques. For example, the overlight element 224 may implement an inverse time comparison (inverse time over EO radiation intensity plot), which may cause the arc light signal 205 to assert if the intensity of the EO radiation is maintained above a threshold for a time determined by an inverse time over-EO radiation plot. The time threshold may be based upon the intensity of the EO radiation; as the intensity of the EO radiation increases, the time required to maintain the EO intensity at the particular level decreases. Alternatively, or in addition, the overlight element 224 may comprise an integrator, which may assert the arc light signal 205 if a particular cumulative intensity is achieved within a predetermined time period (e.g., within a sliding window). Although various comparison techniques are described herein, the overlight element 224 is not limited in this regard and could employ and/or incorporate any comparison method and/or technique known in the art.

Assertion of the arc light signal 205 may be indicative of an arc flash event. Therefore, in some embodiments, the arc light signal 205 may be transmitted to an IED (not shown), may cause one or more protective actions to take place, such as removing the conductor 215 from the power system (e.g., tripping the circuit breaker 206), and/or may be provided as an output of the AFDU 203 (not shown).

In some embodiments, the AFDU 203 may be configured to detect an arc flash event based upon EO and overcurrent stimulus. Accordingly, the arc light signal 205 may flow to an AND gate 228, which may combine the arc light signal 205 with an arc current signal 207. The arc current signal 207 may be asserted upon detection of an overcurrent condition (discussed below).

A current input 211 of the AFDU 203 may be configured to receive current measurements acquired by a CT 213 communicatively and/or electrically coupled to the conductor 215. A filter 225 may filter the current measurements (e.g., using a low-pass filter, a band-pass filter, an anti-alias filter, a combination of filters, or the like). The magnitude of the current measurements may be calculated by an absolute value block 226 and/or sampled (e.g., using an A/D converter (not shown)).

A comparator 227 may use the received current measurements to assert an arc current signal 207. The comparator 227 may implement any comparison technique known in the art. In some embodiments, the comparator 227 may compare the current measurements to a threshold 208. The threshold 208 may be an overcurrent threshold indicative of current levels produced during an arc flash event. Therefore, the arc current signal 207 may be asserted if the current measurements exceed the threshold 208. The threshold 208 may be configurable to allow the sensitivity of the AFDU 203 to be adjusted.

The AFDU 203 may include other overcurrent comparison mechanisms and/or techniques. For example, the AFDU 203 may implement an inverse time over-current comparison, which, as discussed above, may assert the arc current signal 207 if the current measurements exceed a threshold (threshold 208) for a particular time period. The time period may be inversely proportional to the intensity of the current stimulus measurements.

The arc light signal 205 and the arc current signal 207 flow to the AND gate 228, the output of which may comprise an arc flash detection signal 209. In some embodiments, the AFDU 203 may further include a security timer (not shown). The security timer may supervise the arc flash detection signal 209, such that the arc flash detection signal 209 is asserted only if the output of the AND gate 228 is asserted for a pre-determined time period and/or for a pre-determined number of measurement cycles.

The arc flash detection signal 209 may be used to activate one or more protective modules (e.g., protective modules and/or functions of an IED (now shown) upon which the AFDU 203 is implemented). FIG. 2 shows the arc flash detection signal 209 activating a trip signal module 229. The trip signal module 229 may comprise a protective function of a protective device, such as an IED. Assertion of the arc flash detection signal 209 may cause the trip signal module 229 to generate a trip signal to the circuit breaker 206. As discussed above, the arc flash detection signal 209 may be communicated to an IED or other device configured to monitor and/or protect the power system 200. Responsive to assertion of the signal 209, the IED may take one or more protective actions as described above. The circuit breaker 206 may remove the conductor 215 from power, which may clear the arc flash event and minimize the energy released thereby. The AFDU 203 (alone or in conjunction with another device, such as an IED) may be configured to provide other arc flash event monitoring and/or protection mechanisms including, but not limited to: transmitting the arc flash detection signal 209 to an HMI, IED, or other device; tripping additional circuit breakers; diverting power to or from portions of a power system; and the like. In some embodiments, the trip signal generator 229 may be configured to transmit the arc flash detection signal in a particular format and/or using a particular protocol, including, but not limited to: Ethernet, SCADA, IEEE C37.118, SNMP, or the like. As will be appreciated by one of skill in the art, any signaling and/or control mechanism could be used under the teachings of this disclosure.

In some embodiments, the AFDU 203 may be configured to assert the arc flash detection signal 209 based upon the arc light signal 205 alone (e.g., the arc light signal 205 may flow directly to the trip signal input 209, bypassing the AND gate 228). Accordingly, the current input 211, filter 225, absolute value block 226, comparator 227 and/or AND gate 228 may be omitted from the AFDU 203.

The EO radiation collector 217, the EO sensor 221, and/or the EO transmitter/self-test module 219 may be used in connection with any type of arc flash detection unit configured to detect an arc flash event using various different stimulus types (e.g., voltage signals, temperature measurements, chemical readings, pressure measurements, etc.). Therefore, this disclosure should not be read as limited to any particular arc flash detection mechanism and/or technique.

As shown in FIG. 2, the EO radiation collector 217 may be electro-optically coupled to the AFDU 203 by an EO conductor cable 218, which, in some embodiments, may comprise a fiber optic cable. The operation and/or configuration of the EO conductor cable 218 and/or the EO radiation collector 217 may be validated by a self-test operation provided by inter alia an EO transmitter/self-test module 219. In some embodiments, the EO conductor cable 218 may include a plurality of EO conductor cables, including a first conductor and a second conductor. The EO conductor cables 218 may be coupled to the EO radiation collector 217, such that there is an optical path therebetween. A first one of the conductors 218 may be coupled to the EO sensor 221, and a second one of the conductors 218 may be coupled to an EO transmitter/self-test module 219. The EO transmitter/self-test module 219 may be configured to periodically provide test pulses to the EO radiation collector 217 (via the second conductor), which may be transmitted to the EO sensor 221 via the conductor 218 (e.g., the first one of the conductors 218). The EO transmitter/self-test module 219 may be communicatively coupled to the EO sensor 221 to detect an EO signal responsive to the test pulse. If an EO signal responsive to the test pulse is detected, the EO radiation collector 217 (and EO conductor cable 218) may be validated; otherwise, a fault may be detected. Responsive to detection of a fault, the EO transmitter/self-test module 219 may cause one or more alarms to be asserted, issue one or more alerts, trip one or more breakers, and/or take other actions.

As discussed above, the EO radiation collector 217 may include a point collector, a loop EO radiation collector, or other EO radiation collector type. A self-test as disclosed herein may be performed on any type of EO radiation emitter, EO radiation collector, EO conductor, and/or EO sensor.

Figure 3:
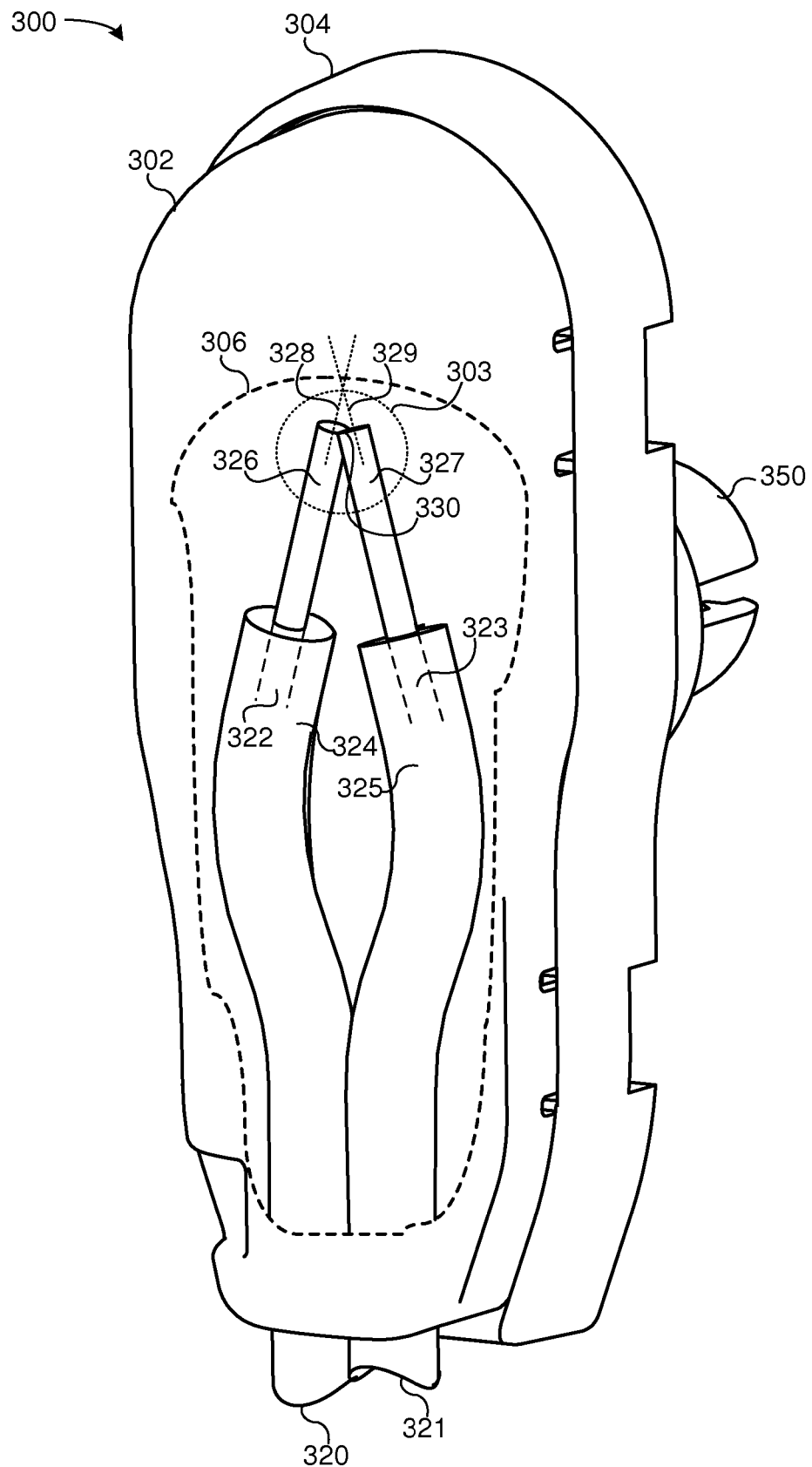
FIG. 3 illustrates one embodiment of an electro-optical radiation collector.

FIG. 3 illustrates one embodiment of an EO radiation collector 300, which may include a cap 302, a base portion 304, and a mounting portion 350. FIG. 3 shows a cut-away 306 of the cap 302 to expose the components therein. In some embodiments, portions of the cap 302 may be formed of materials adapted to transmit EO radiation. Portions of the cap 302 may be transparent to all frequencies of EO radiation. Alternatively, the cap 302 may be configured to transmit only certain types of EO radiation (e.g., certain frequencies, wavelengths, and/or intensities).

In the FIG. 3 example, the EO radiation collector 300 houses two EO conductor cables, a first EO conductor cable 320 and a second EO conductor cable 321. Each of the EO conductor cables 320 and 321 may comprise inner EO conductors 322 and 323 (e.g., fiber optic cables) within respective sheaths 324 and 325, which may be opaque to EO radiation (e.g., may be non-electro-optically conductive). As shown in FIG. 3, the sheathing 324 and 325 may be removed at respective end portions of the EO cables 320 and 321 to expose portions 326 and 327 of the EO conductors 322 and 323. EO radiation received by the exposed portions 326 and/or 327 and transmitted on the EO conductor cables 320 and 321 via the EO conductors 322 and 323.

The exposed portions 326 and 327 may be secured within the EO radiation collector 300 at a particular orientation with respect to one another. However, alternative configurations and placements of the EO conductor cables 320 and 321 are possible through modification to the cap 302, the base 304, and the like. In some embodiments, and as illustrated in FIG. 3, the EO conductor cables 320, 322 may be mounted within the EO radiation collector 300, such that the axis 329 of the first EO conductor cable 320 is non-parallel to the axis 329 of the second EO conductor cable 321. The orientation of the longitudinal axes 328 and 329 may allow for an EO path between the EO conductor cables 320 and 322, in which EO radiation emitted from the first EO conductor cable 320 (via the exposed portion 326 thereof) may be received by the second EO conductor cable 321 (via the exposed portion 327), and vice versa.

In some embodiments, the EO path between the EO conductor cables 320 and 321 may include the cap 302. Accordingly, the cap 302 may be configured to transmit EO radiation between the exposed portions 326 and 327 of the EO conductor cables 320 and 322. For example, the cap 302 may include material configured to diffuse EO radiation. Accordingly, a portion of EO radiation emitted from the exposed end 326 of the first EO conductor cable 320 may be diffused within the cap 302 material and received by the exposed end 327 of the second EO conductor cable 321. In some embodiments, the cap 302 may comprise refractive materials configured to direct EO radiation between the exposed portions 326 and 327. The cap 302 may include reflective portions to reflect EO radiation between the portions 326 and 327.

In some embodiments, the cap 302 may be configured to emit a portion of EO radiation received via the first and/or second EO conductor cables 320 and/or 321. Accordingly, when EO radiation is emitted from the exposed portion 326 of the first EO conductor cable 320 and/or from the exposed portion 327 of the second EO conductor cable 321, a portion of the EO radiation may be emitted from the cap 302. If the EO radiation is in the visible spectrum, the emission may allow a human in the vicinity of the EO radiation collector 300 to visually confirm that EO radiation has been received (e.g., transmitted to the EO radiation collector 300 via the first and/or second EO conductor cable(s) 320 and/or 321).

As shown in FIG. 3, the ends of the exposed portions 326 and 327 may be at substantially the same position within in the cap 302 (e.g., at the same vertical offset within the cap 302). Accordingly, the exposed portions 326 and 327 may both fall within the EO radiation receiving area 303. In some embodiments, the exposed portions 326 and 327 may be in contact with one another at a location 330. In some embodiments, the ends of the exposed portions 326 and 327 may be adapted (filed down) to increase the contact area therebetween (e.g., to create a contact plane between the portions 326 and 327 at the location 330). Although not shown in FIG. 3, in some embodiments, the ends of the exposed portions 326 and 327 may be secured in contact using a securing member, such as a clamping device, clip, resilient member, or the like.

As discussed above, the cap 302 may be formed of material adapted to transmit EO radiation. Accordingly, EO radiation emitted in the vicinity of the EO radiation collector 300 may be transmitted through the cap portion 302 into the exposed portions 326 and 327 of the EO conductor cables 320 and 321. The cap 302 may be adapted to diffuse and/or direct (e.g., focus) incident EO radiation into an EO radiation receiving area 303. The nature (e.g., size, orientation, etc.) of the EO radiation receiving area 303 may be determined by the configuration of the cap 302. For example, the cap 302 may include materials having differing thicknesses and/or of differing optical qualities, which may cause EO radiation to be directed to different locations within the EO radiation collector 300. In the FIG. 3 embodiment, the EO radiation receiving area 303 corresponds to the location of both of the exposed portions 326 and 327 of the first and the second EO conductor cables 320 and 321. Accordingly, both the first and the second EO conductor cables 320 and 321 may be situated within the receiving area of the collector 300 and, as such, may be capable of optimally collecting EO radiation emitted in the vicinity of the EO radiation collector 300.

Figure 4:
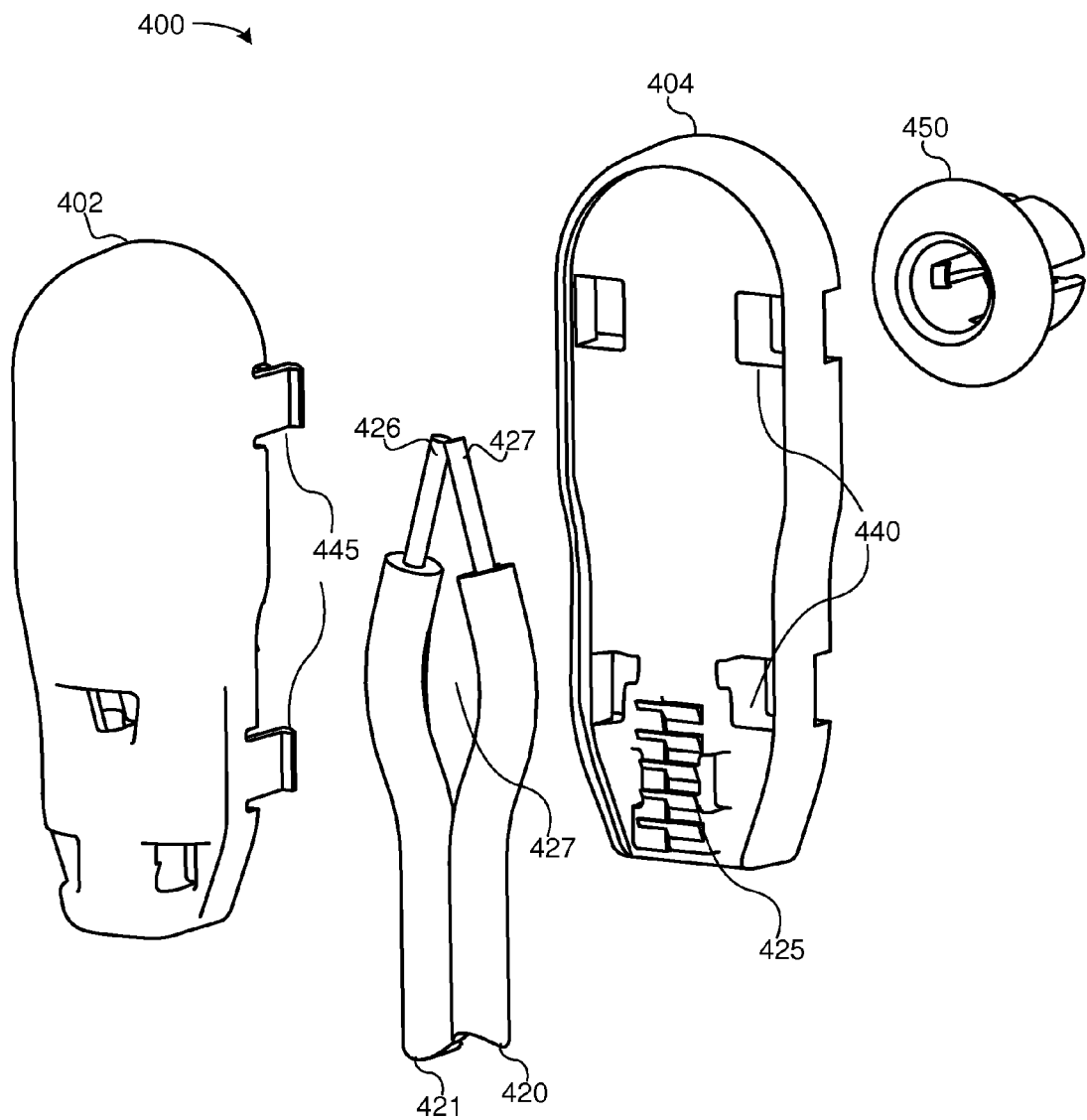
FIG. 4 is an exploded view of one embodiment of an electro-optical radiation collector.

FIG. 4 is an exploded view of another embodiment of an EO radiation collector. A cap 402 may be detached from a base portion 404 and a mounting portion 450 of the EO radiation collector 400. In the FIG. 4 example, the EO conductor cables 420 and 421 are depicted as if secured within the EO radiation collector 400. As illustrated, the exposed ends 426 and 427 thereof may be mounted such that the longitudinal axes are not parallel with respect to one another.

The manufacture and configuration of an EO radiation collector (e.g., the cap 402, base portion 404, and the like) may be according to various configurations and materials as are known in the art. According to some embodiments, the cap 402 and the base portion 404 may be formed from electrically non-conductive materials. The EO radiation collector 400 may be modified for a particular application in which specific materials, sizes, or configurations are desired. The EO radiation collector 400, comprising the base portion 404 and the cap 402, may be manufactured as one piece or as two or more separable and/or inseparable pieces.

In some embodiments, the cap 402 may be secured to the base portion 404 by a fastening means, such as a weld, adhesive, fusing, snaps, clips, resilient members, cement, zip ties, and/or other fastening means known in the art. In the FIG. 4 example, the cap 402 includes protruding clips 445 configured to mate with clip receivers 440 in the base portion 404. Insertion of the clips 445 into the receiver 440 may secure the cap onto the base portion 404.

The EO radiation collector 400 may include means for securing one or more EO conductor cables (e.g., cables 420 and/or 421). The securing means may include any means for securing EO conductor cables known in the art including, but not limited to: adhesives, glue, clips, resilient members, gripping members, resilient teeth, clamping mechanisms, clamping members, zip ties, or the like. In the FIG. 4 example, the case 404 includes a gripping member 425 configured to secure the EO conductor cables 420 and 421 within the EO radiation collector 400. The gripping member may comprise a plurality of resiliently deformable teeth adapted to frictionally engage and secure the EO conductor cables 420 and/or 421. Although not shown in FIG. 4, an additional member (an independent component and/or formed as part of the base portion 404 and/or cap portion 402) may be adapted to position the exposed ends 426 and/or 427 in a particular orientation within the EO radiation collector (e.g., provide the bend 427 in the EO conductor cables 420 and 421 depicted in FIG. 4). The member may be a protrusion, grooves, or any other means for positioning the EO conductor cables 420 and/or 421 in a particular orientation.

The EO radiation collector may include a mounting portion 450 to secure the EO radiation collector 400 onto a particular type of surface (e.g., within a switchgear enclosure or housing). Depending on the desired mounting surface, a wide variety of conceivable features may be used, such as an adhesive patch, a bolt receiver, one or more clips adapted to be received by a clip receiver, or the like.

As illustrated in FIG. 4, the EO radiation collector 400 may receive two EO conductor cables 420 and 421, which may enter the EO radiation collector 400 from a bottom portion of the cap 402 and/or base portion 404. According to alternative embodiments, the EO radiation collector 400 may be adapted to receive any number of EO conductor cables of various types. Additionally, the EO radiation collector may be adapted to receive the EO conductor cables from the sides, top, bottom, and/or a combination thereof. Moreover, means for receiving the EO conductor cables (e.g., the cable entrances and securing means) may be configured to allow one EO conductor cable to be removed while other cable(s) within the EO radiation collector 400 remain fixedly secured. As previously discussed, according to various embodiments, the plurality of cables entering the EO radiation collector 400 may be oriented and/or bent, such that the longitudinal axes of each of the cables are not parallel with one another, that the exposed portions of the EO conductor cables are within a receiving area of the EO radiation collector (e.g., the EO radiation receiving area 303 of FIG. 3), the ends of the exposed portions of the EO conductor cables therein are at substantially the same height and/or position as one another, and/or EO radiation transmitted from one of the EO conductor cables may be received by one or more of the other EO conductor cables and/or emitted from the cap 402.

Figure 5:
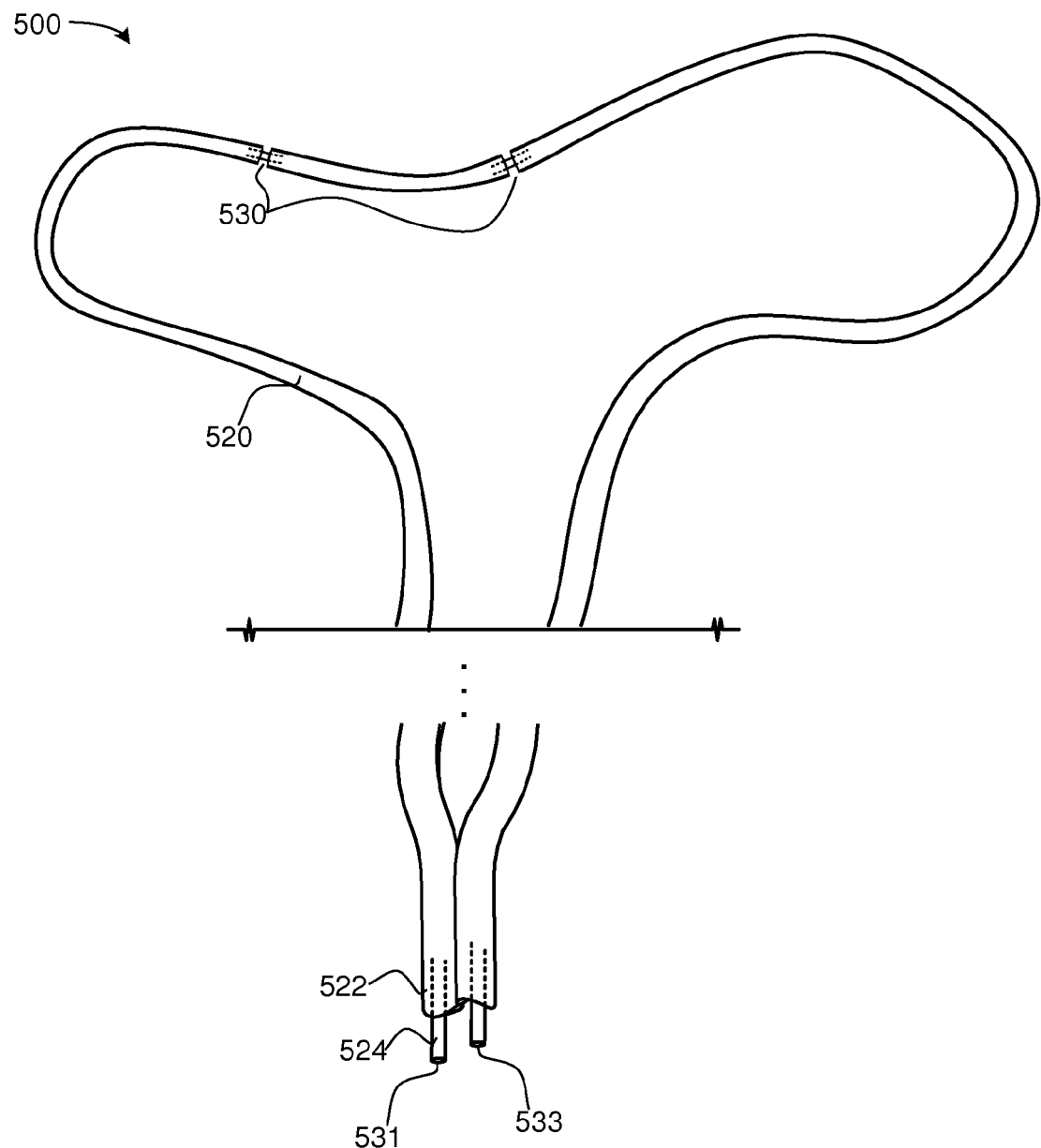
FIG. 5 illustrates one embodiment of a loop electro-optical radiation collector.

FIG. 5 shows one embodiment of a loop EO radiation collector 500. The loop EO radiation collector may comprise a loop of EO conductor cable 520. The EO conductor cable 520 may include an EO conductor 524 (e.g., a fiber optic cable) enclosed within a sheath 522, which may be non-conductive to EO radiation (e.g., opaque with respect to EO radiation). The sheath may include openings 530 at various locations. The openings may allow EO radiation to be transmitted into and out of the loop EO radiation collector 500. Accordingly, the openings may be positioned within the vicinity of switchgear equipment or other power system components. EO radiation produced by an arc flash may be received by the EO conductor 524 via the opening(s) 530. The opening(s) may be of arbitrary length along the loop EO radiation collector, encompassing up to the full length of the loop EO radiation collector 500. EO radiation received by the loop EO radiation collector 500 may be transmitted by the EO conductor 524 to an EO radiation receiver (not shown), which may be positioned at either end 531 or 533 of the EO conductor cable 520.

Figure 6:
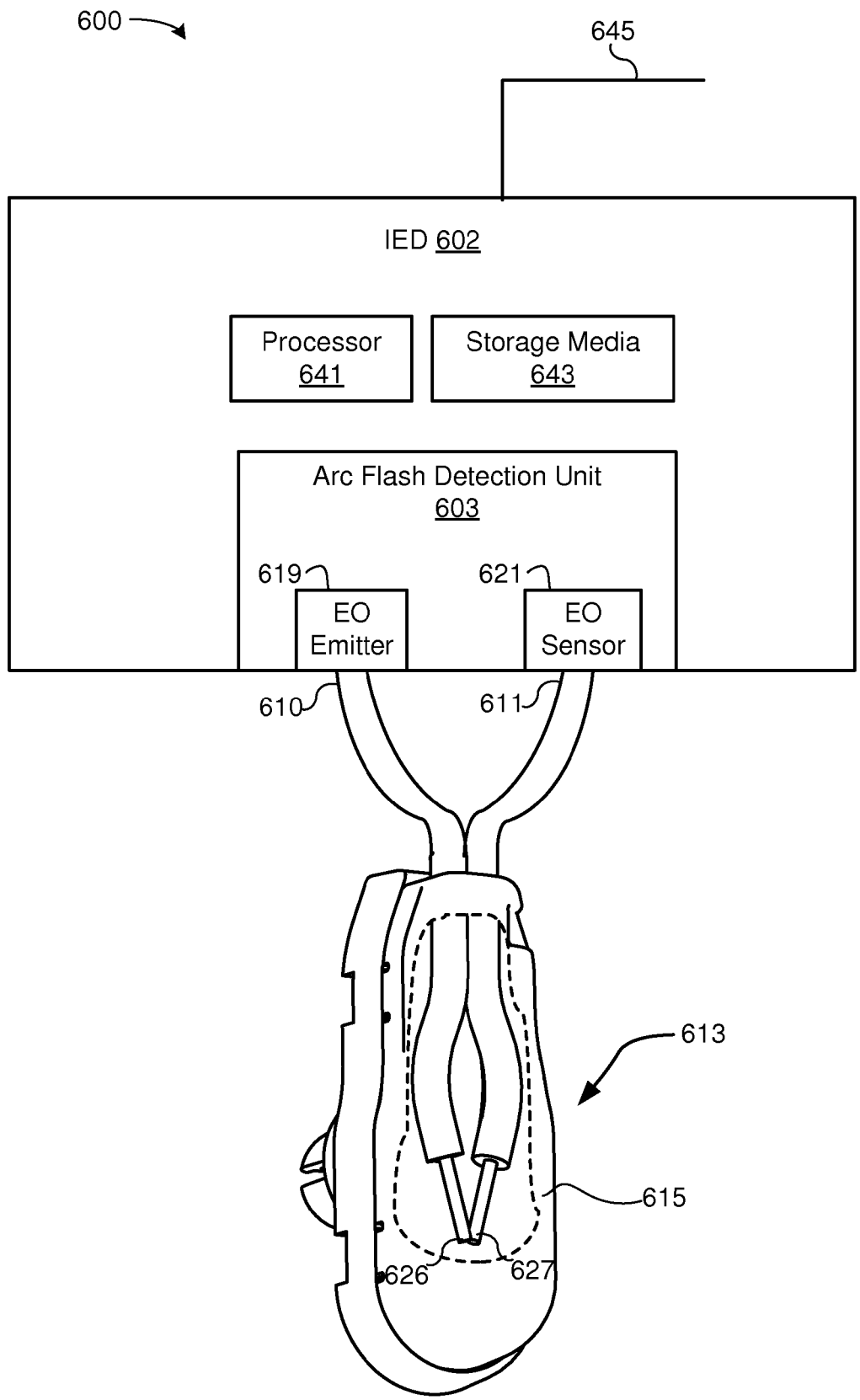
FIG. 6 is a block diagram of one embodiment of an apparatus configured to provide arc flash monitoring and protection with self-test.

FIG. 6 provides an exemplary block diagram of an apparatus for detecting EO radiation indicative of an arc flash event. The apparatus 600 may be capable of performing self-tests to validate the proper operation and/or configuration of the EO radiation collectors connected thereto (e.g., the EO radiation collector 613) and the EO path between the EO radiation collectors and the apparatus 600 (e.g., the EO conductor cables 610 and 611).

As shown in FIG. 6, the EO radiation collector 613 may be similar to the EO radiation collectors 300 and/or 400 disclosed above in conjunction with FIGS. 3 and 4. Alternatively, or in addition, the EO radiation collector 613 may be a loop EO radiation collector, such as the collector 500 of FIG. 5.

The apparatus 600 may include an arc flash detection unit 603, which may be implemented similarly to the AFDU 203 disclosed above in conjunction with FIG. 2. The AFDU 603 or portions thereof may be implemented within and/or in conjunction with an IED 602.

The AFDU 603 and/or IED 602 may be communicatively coupled to the EO radiation collector 613 by EO conductor cables 610 and 611. The EO conductor cables 610 and 611 may include an EO conductor sheathed in a non-EO conductive sheathing. End portions 626 and 627 of the EO conductor cables 610 and 611 may be disposed within the EO radiation collector 610 as described above.

According to the illustrated embodiment, the IED 602 and/or the AFDU 603 may include a processor 641 (which may be a microprocessor, field programmable gate array (FPGA), application specific integrated circuit (ASIC), or the like) and computer-readable storage media 643 (e.g., disk storage, optical storage, Flash memory, RAM, or the like). The AFDU 603 may use the processor and/or storage media 643 to provide arc flash monitoring and protection functionality, including self-test. The computer-executable instructions for the self-test functions may be stored within the storage media 643. The self-test may be configured to automatically operate on a scheduled basis (for example, every four hours), continuously, and/or operate when a command is received via a communications link or interface 645.

In some embodiments, a self-test may comprise causing an EO emitter 619 to emit EO radiation into a first EO conductor cable 610. The EO emitter 619 may be any EO radiation source known in the art, such as a flash bulb, an LED, or the like. If the EO cable 610 is functioning properly, EO radiation produced by the EO emitter 619 may be transmitted to the EO radiation collector 613 by the EO conductor cable 610. The EO radiation may be emitted from the exposed portion 626 of the EO conductor cable 610. As discussed above, the EO radiation collector 613 may be configured to emit a portion of the received EO radiation, allowing a human observer to observe the EO radiation (e.g., to verify that the EO conductor cable 610 is functioning to transmit EO radiation to the EO radiation collector 613 from the apparatus 600).

The EO radiation collector 613 may be further configured to provide an EO path between the exposed portions 626 and 627 of the EO conductor cables 610 and 611. The EO path may be enabled by an orientation of the exposed portions 626 and 627 within the EO radiation collector 613. In addition, a cap 615 (or other components) of the EO radiation collector 613 may be configured to provide portions of the EO path (e.g., direct EO radiation from the exposed portion 626 to the exposed portion 627 and vice versa).

If the EO radiation collector 613 is operating properly and/or is properly configured (e.g., the exposed portions 626 and 627 are properly oriented within the collector 613 and the like), EO radiation transmitted into the EO radiation collector 613 via EO conductor cable 610 may be received by the EO conductor cable 611. The detected EO radiation may be received by an EO sensor 621, which may be configured to convert the received EO radiation into an electric signal (e.g. current and/or voltage signal), which, as discussed above, may be filtered, amplified, and/or quantized (e.g., by an A/D converter). The resulting signal may then be received by the AFDU 603 and/or processor 641, which may validate the operation and/or configuration of the EO radiation collector 613 and/or the EO conductor cables 610 and 611.

In some embodiments, if an EO signal is emitted from the EO emitter 619, but no EO signal is received by the EO sensor 621 (or the signal is below an attenuation threshold), the AFDU 603 and/or IED 602 may detect a self-test failure. In response to detecting a self-test failure, the AFDU 603 and/or the IED 602 may take one or more actions including, but not limited to: asserting one or more alarms, transmitting one or more alert signals (e.g., via the communications interface 645), tripping one or more breakers, or the like.

According to one embodiment, the self-test may be performed continuously. Furthermore, according to one embodiment, the cap 615 of the EO radiation collector 613 is visibly illuminated by the self-test EO radiation such that a human (e.g., a technician or other personnel) may visibly confirm that EO radiation is being transmitted to at least that point within the system.

In some embodiments, the AFDU 603 and/or IED 602 may be configured to stop arc flash monitoring during a self-test operation. Alternatively, or in addition, the AFDU 603 and/or the IED 602 may be configured to distinguish between EO radiation received as part of a self-test operation and EO radiation indicative of an arc flash event. For instance, in some embodiments, the AFDU 603 and/or the IED 602 may be configured to cause the EO emitter 619 to emit EO radiation according to a particular pattern. The pattern may comprise a low-correlation coded signal or waveform. During a self-test operation, the EO sensor 621 may receive return signals indicative of the coded signal. Accordingly, the AFDU 603 and/or IED 602 may be capable of distinguishing between EO radiation indicative of an arc flash event and EO radiation received as part of a self-test, which may allow the apparatus 600 to perform self-testing while simultaneously providing arc flash monitoring and/or protection. The simultaneous self-test and/or monitoring may be provided independently of the nature of the EO radiation emitted by the EO emitter 619. Accordingly, the EO radiation pattern emitted by the EO emitter 619 may be of the same wavelength, frequency, and/or intensity as would be produced in an arc flash event. As such, the self-test may be capable of validating the EO radiation collector 613 and/or EO conductor cables 610 and 611 within the parameters (e.g., frequency, wavelength, and/or intensity), of an actual arc-flash event. Alternatively, or in addition, the EO emitter 619 may be configured to emit EO radiation of a different frequency and/or wavelength than that produced during an arc flash event. The resulting EO signals may be distinguished by the AFDU 603 and/or IED 602 to prevent false arc flash detections.

In some embodiments, the EO emitter 619 may be separate from the IED 602 and/or 603. For example, the EO emitter 619 may be disposed in proximity to the EO radiation collector 613. Accordingly, EO radiation emitted by the EO emitter 619 may be received directly at the EO radiation collector 613 (without being transmitted via the EO conductor cable 610). Although not shown in FIG. 6, the remote EO emitter 619 may be configured to emit EO radiation detectable by a plurality of EO collectors, which may provide for concurrent self-testing of the plural EO collectors, one or more of which may be electro-optically coupled to different AFDU 603 and/or IED 602 devices.

In some embodiments, the self-test may determine where a self-test failure has occurred. As discussed above, the EO radiation collector 613 may be configured to emit EO radiation received via an EO cable 610 and/or 611 (e.g., via the cap 615). An additional sensing device (not shown), such as a human observer (or additional EO radiation collector) may be placed within an EO path of the EO radiation collector 613 to detect EO radiation emitted thereby. If, during a self-test, EO radiation is detected from the EO radiation collector 613, but no return signal is received via the EO conductor cable 611, the IED 602 and/or AFDU 603 may determine that the EO conductor cable used to transmit the EO signal to the EO radiation collector 613 (e.g., EO conductor cable 610) is operable, but that a fault exists within the EO radiation collector 613 and/or in the EO conductor cable 611. The self-test may switch the EO conductor cables and re-run the self-test (e.g., connect the EO emitter 619 to the EO conductor cable 611 and the EO sensor 621 to the EO conductor cable 610). The switch may be made via an EO switching device (not shown), modification of physical connections, or the like. If, after the switch, the EO radiation collector 613 emits EO radiation during the self-test, the fault may be determined to be in the EO radiation collector 613 itself (since the other EO conductor cable, cable 611, has transmitted EO radiation to the collector 613). If the EO radiation collector 613 does not emit EO radiation after the switch, the fault may be determined to be in the EO conductor cable 611. Although a particular self-test scenario is described herein, the disclosure is not limited in this regard. The AFDU 603 and/or the IED 602 may be configured to perform any self-test and/or adaptive self-test known in the art.

The status of the self-test operations performed by the IED 602 and/or AFDU 603 may be displayed on an HMI (not shown) and/or communicated via interface 645. Alternatively, or in addition, the results of the self-test operations may be stored on the computer-readable storage media 643. The results may be made available to personnel via the HMI, or other interface (e.g., interface 645). The display and/or results of the self-test may include the attenuation (if any) observed during the test (e.g., a difference between the intensity of EO radiation transmitted into the EO radiation collector 613 versus the intensity of the EO radiation received by the EO sensor 621), the response time of the AFDU 603 and/or IED 602 to detect the return signal, a probable location of the failure (if any), or the like.

Figure 7:
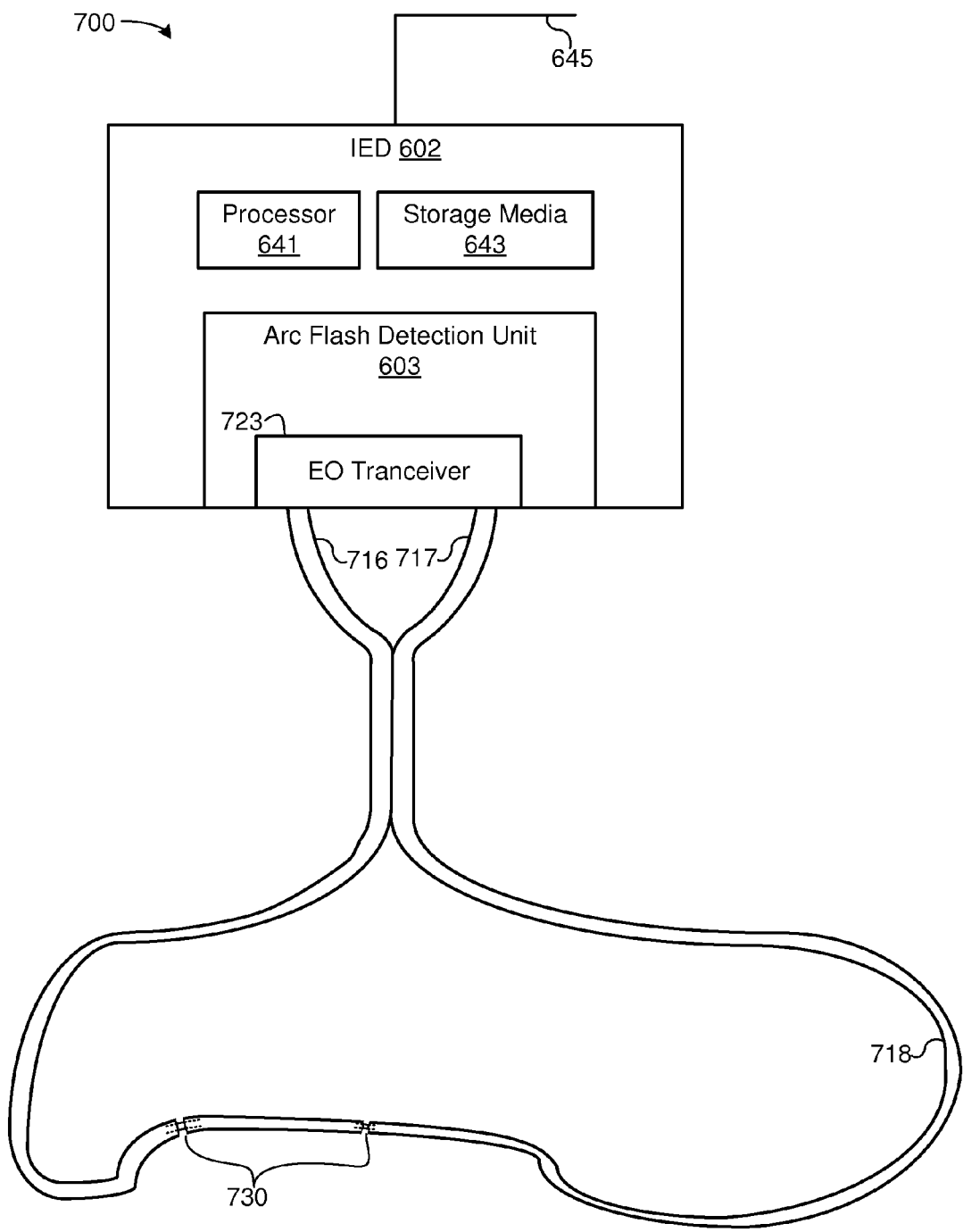
FIG. 7 is a block diagram of another embodiment of an apparatus configured to provide arc flash monitoring and protection with self test.

FIG. 7 illustrates an exemplary block diagram of an apparatus for detecting EO radiation indicative of an arc flash event. The apparatus 700 may be capable of performing self-tests to validate the proper operation and/or configuration of the EO radiation collectors connected thereto (e.g., the EO radiation collector 718).

The FIG. 7 example shows the use of a loop EO radiation collector 718 having a first end 716 and a second end 717. The first and second ends 716 and 717 may be electro-optically coupled to an EO radiation transceiver 723, which may be configured to emit and receive EO radiation on either of the ends 716 and/or 717 of the loop EO radiation collector 718. In an alternative embodiment, the AFDU 603 may comprise separate EO emitter and EO sensor components, such as the EO emitter 619 and the EO sensor 621 of FIG. 6.

The loop EO radiation collector 718 may comprise an EO conductor cable encased in a sheathing material. The sheathing material may be substantially opaque to EO radiation. The sheathing may be opened in various locations 730 to expose the inner EO conductor. EO radiation emitted in the vicinity of the loop EO radiation collector 718 may be received at the exposed locations 730 and transmitted to either the first end 716 and/or the second end 717 of the loop EO radiation collector 718.

The IED 602 and/or AFDU 603 may be configured to perform a self-test operation by causing the EO radiation transceiver 723 to emit EO radiation into an end 716 and/or 717 of the loop EO radiation collector 718 and detecting EO radiation responsive corresponding to the emitted EO radiation. The transceiver 723 may receive the EO radiation at either end 716 and/or 717 of the loop EO radiation collector 718. An attenuation of the loop EO radiation collector 718 may be determined by comparing an intensity of the detected EO radiation to the intensity of the emitted EO radiation. The status of the self-test operation and/or the attenuation of the loop EO radiation collector 718 may be displayed on a HMI (not shown) and/or communicated via interface 645.

If the loop EO radiation collector 718 is unable to transmit the emitted EO radiation signal (e.g., from the first end 716 to the second end 717 or vice versa), the self-test operation may fail. Similarly, if the received EO radiation is below a particular threshold and/or has attenuated more than a threshold amount, the self-test may fail. The attenuation may be caused by abrasion on the loop EO radiation collector 718, excessive length of the loop EO radiation collector 718, or the like. Responsive to a self-test failure, the AFDU 603 and/or IED 602 may perform one or more actions as described above.

As discussed above, the apparatus 700 may be configured to perform self-testing concurrently with providing arc flash monitoring and protection. The EO emitter 619 may be configured to emit EO radiation that is distinguishable from EO radiation emitted in an arc flash event. In some embodiments, the EO emitter 619 may emit EO radiation according to a particular pattern (e.g., a coded signal), at a particular wavelength and/or frequency, or the like. The EO sensor 621, AFDU 602, and/or IED 603 may distinguish the EO radiation of the self-test from EO radiation indicative of an arc flash (e.g., by comparing the received EO radiation to a known pattern, or the like).

In an alternative embodiment, the EO emitter 619 and the EO sensor 621 may be replaced by an EO radiation transceiver (not shown). The EO radiation transceiver may be capable of emitting and/or detecting EO radiation over either end 716 or 717 of the loop EO radiation collector 718. Accordingly, the EO radiation transceiver may be capable of switching the direction of the self-test (e.g., transmitting the EO radiation emitted thereby into the second end 717 of the loop EO radiation collector 718, as opposed to the first end 716 of the collector. According to another embodiment, self-test EO radiation by the EO radiation transceiver may be transmitted through the loop EO radiation collector 718 and may be at least partially reflected back to the transceiver when the self-test pulse reaches the second end 717 or the final end of the loop EO radiation collector 718.

Figure 8:
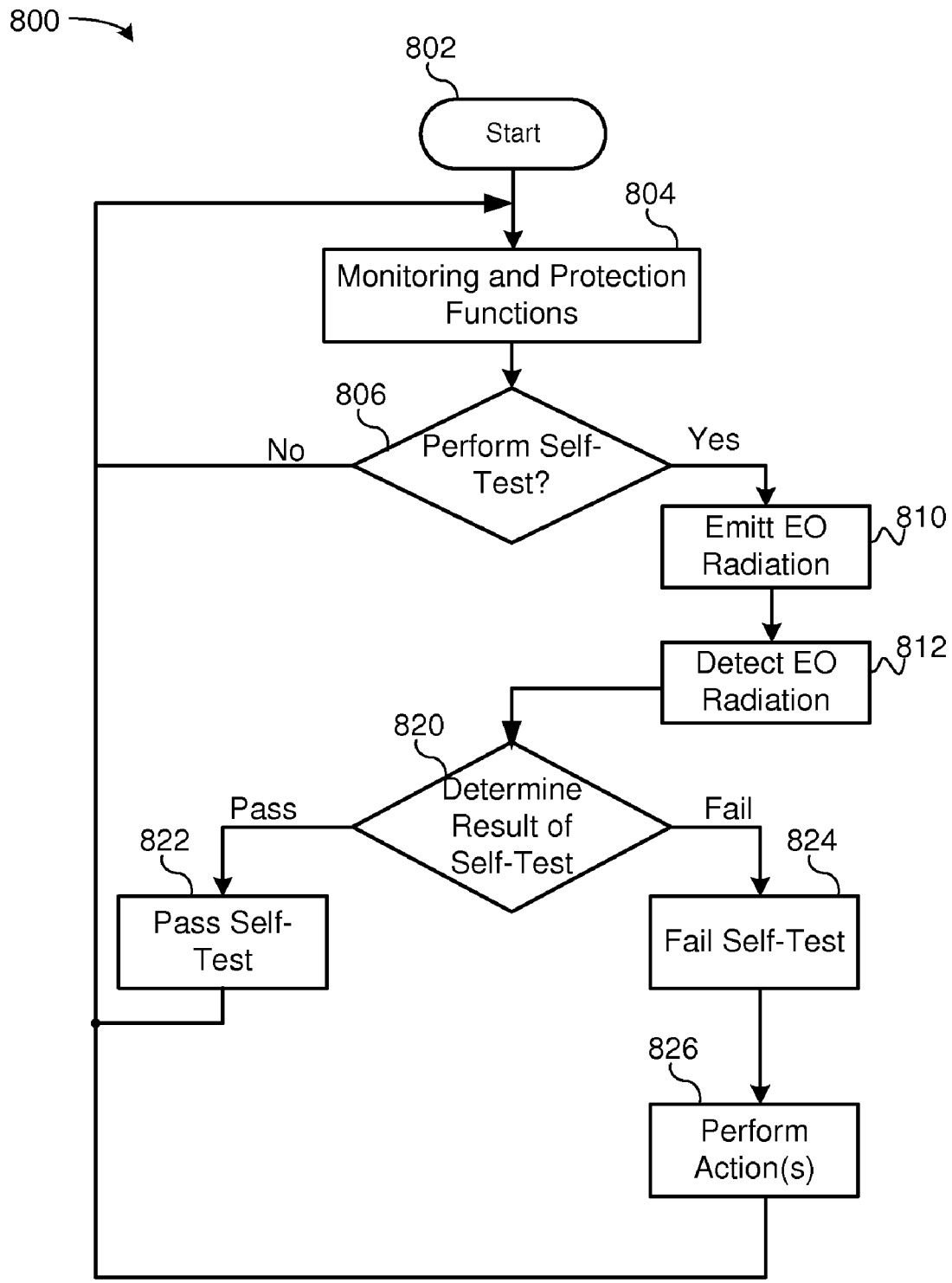
FIG. 8 is a flow chart illustrating an exemplary method of performing a self-test, according to one embodiment.

FIG. 8 is a flow diagram of one embodiment of a method 800 for performing a self-test using an existing arc flash protection system. The method 800 may comprise one or more machine executable instructions stored on a computer-readable storage medium. The instructions may be configured to cause a machine, such as a computing device or IED, to perform the method 800. In some embodiments, the instructions may be embodied as one or more distinct software modules on the storage medium. One or more of the instructions and/or steps of method 800 may interact with one or more hardware components, such as computer-readable storage media, communications interfaces, EO radiation collectors, EO emitters, and the like. Accordingly, one or more of the steps of method 800 may be tied to particular machine components.

At step 802, the method 800 may start, which may comprise allocating and/or initializing resources required by the method 800, such as communications interfaces, processing resources, and the like. At step 804, the method 800 may perform an arc flash monitoring function 804, which may comprise receiving EO radiation detected by one or more EO radiation collectors in the vicinity of a power system. The arc flash monitoring and protection function of step 804 may be based upon EO radiation alone and/or may be based upon a combination of EO and other types of stimulus (e.g., current, voltage, particulate, etc.).

At step 806, the method 800 may determine whether a self-test operation may be performed. A self-test operation may be performed continuously during the monitoring and/or protection function of the method 800 or may be performed at a particular internals. In some embodiments, the monitoring and protection functions of method 800 may be suspended while a self-test is in process. Alternatively, a self-test may be performed concurrently with arc flash protection and monitoring. If a self-test is not to be performed at step 806 (either because the periodic or scheduled self-test is not due, or because the user has disabled self-tests), the flow may return to step 804 where monitoring may continue; otherwise, the flow may continue to step 810

At step 810, the method 800 may cause EO radiation to be emitted to one or more EO radiation collectors. In some embodiments, when the EO radiation is emitted, monitoring and protection functions may be suspended. Alternatively, monitoring and protection functions may continue operation.

In some embodiments, the EO radiation emitted at step 810 may be transmitted to the EO radiation collector via a first EO conductor cable that is electro-optically coupled to an EO radiation collector (e.g., the EO conductor 610 of FIG. 6). The emitted EO radiation may be received at the EO radiation collector and transmitted to a second EO conductor cable (e.g., the EO conductor 611 of FIG. 6). The second EO conductor cable may be electro-optically coupled to an EO sensor configured to provide EO radiation measurements to the method 800.

In another example, EO radiation may be emitted by an EO emitter (or transceiver) into a first end of a loop EO radiation collector (e.g., end 716 of the loop EO radiation collector 718 of FIG. 7). The emitted EO radiation may be transmitted through the loop EO radiation collector to a second end thereof (e.g., end 717 of the loop EO radiation collector 718 of FIG. 7). The second end of the loop EO radiation collector may be electro-optically coupled to an EO sensor (or transceiver), which may provide EO radiation measurements to the method 800.

In some embodiments, the EO radiation emitted at step 810 may be configured to be distinguishable from other, non-emitted EO radiation (e.g., EO radiation indicative of an arc flash event). The emitted EO radiation may, for example, be emitted in a particular pattern. In some embodiments, the EO radiation may be emitted as a coded signal. The coded signal may comprise a known sequence of EO radiation pulses (e.g., a known, random EO radiation pulse sequence). Alternatively, a particular EO radiation wavelength and/or intensity may be emitted. In this case, the EO radiation may be distinguished using a filter, clipping filter, or the like.

At step 812 EO radiation corresponding to the emitted EO radiation may be detected by an EO sensor. Step 812 may include distinguishing between the EO radiation emitted at step 810 from other, non-emitted EO radiation detected by the EO radiation collector. The distinguishing may comprise comparing the EO radiation to a known pattern (e.g., a coded signal), filtering the EO radiation, processing the EO radiation, or the like. If the EO radiation emitted at step 810 was emitted according to a coded signal, the determining may include using the coded signal to distinguish the EO radiation (e.g., by comparing the EO radiation to the coded signal pattern, or the like).

At step 820, the method 800 may determine a result of the self-test operation. In some embodiments, the result may be based upon whether EO radiation corresponding to the emitted EO radiation was detected at step 812. If no corresponding EO radiation was detected (or less than a threshold amount of EO radiation was detected), the self-test operation may fail and the flow may continue to step 824. If EO radiation was detected at step 812, the self-test operation may pass and the flow may continue to step 822.

In some embodiments, step 820 may include determining an attenuation of the emitted EO radiation signal. The attenuation may be related to difference in amplitude and/or intensity between the EO radiation signal emitted at step 810 and the EO radiation signal detected at step 812. The self-test operation may fail (and the flow may continue to step 824) if the signal attenuation exceeds a threshold. If the attenuation does not exceed the threshold, the self-test operation may pass and the flow may continue to step 822.

Although not shown in FIG. 8, in some embodiments, step 820 may include determining a self-test warning. The self-test warning may be detected if the attenuation determined at step 820 is insufficient to cause a self-test failure, but exceeds a "pass" attenuation threshold (e.g., is less than a "fail" attenuation threshold, but is greater than a "pass" attenuation threshold). A warning may cause the method 800 to display a warning message or other alert on a HMI and/or to transmit the message to an operator (e.g., via a communications network, email, SMS, or the like). The warning may indicate that the EO radiation collector is beginning to exhibit high attenuation levels and should be checked and/or replaced before a failure occurs. After transmitting the warning message, the flow may continue to step 822.

Step 820 may include recording the result of the self-test operation on a computer-readable storage medium, displaying the result on a HMI, or the like. The self-test result may indicate the nature of the EO radiation provided to the sensor (e.g., the intensity, wavelength, coded signal pattern, or the like), the attenuation exhibited by the EO radiation collector, the response time (if any) required to detect EO radiation corresponding to the emitted signal, and the like. In addition, any warnings or alerts may be recorded (e.g., warnings of a high attenuation level, a self-test failure, and so on).

At step 822, the self-test operation may pass. The pass may include displaying an indication on a HMI (e.g., a green pass indicator on a display of the EO radiation collector) or the like. The flow may then continue to step 804 where arc flash monitoring and/or protection may continue. If arc flash monitoring and protection operations were suspended at step 810, the monitoring and protection services may be reactivated at step 822.

At step 824, the method 800 may display the results of the self-test failure. The display may be provided on a HMI (e.g., a failure indicator on a display of the EO radiation collector). The record of the failure may indicate how much (if any) EO radiation was detected at step 812, may indicate the attenuation level observed (as compared to an attenuation threshold), may provide an indication of a location of a fault (e.g., by reversing the flow of EO radiation and/or using an additional EO sensor, or the like as described above), or the like.

At step 826, the method 800 may take one or more actions responsive to detecting the self-test failure. As describe above, the actions may include asserting one or more alarms, issuing one or more alerts, tripping one or more breakers, or the like. The method 800 may then continue monitoring as described above (e.g., using any remaining, operable EO radiation collectors). Alternatively, the monitoring may stop until the failed EO radiation collector is repaired or replaced.

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

Furthermore, the described features, operations, or characteristics may be combined in any suitable manner in one or more embodiments. It will also be readily understood that the order of the steps or actions of the methods described in connection with the embodiments disclosed may be changed as would be apparent to those skilled in the art. Thus, any order in the drawings or Detailed Description is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps, or by a combination of hardware, software, and/or firmware.

Embodiments may also be provided as a computer program product including a computer-readable storage medium having stored instructions thereon that may be used to program a computer (or other electronic device) to perform processes described herein. The computer-readable storage medium may include, but is not limited to: hard drives, floppy diskettes, optical disks, CD-ROMs, DVD-ROMs, ROMs, RAMs, EPROMs, EEPROMs, magnetic or optical cards, solid-state memory devices, or other types of media/machine-readable storage media suitable for storing electronic instructions.

As used herein, a software module or component may include any type of computer instruction or computer executable code located within a memory device and/or computer-readable storage medium. A software module may, for instance, comprise one or more physical or logical blocks of computer instructions, which may be organized as a routine, program, object, component, data structure, etc., that perform one or more tasks or implements particular abstract data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

It will be understood by those having skill in the art that many changes may be made to the details of the above-described embodiments without departing from the underlying principles of the invention.

What is claimed is:

1. A method of performing a self-test of an arc flash detection device comprising an electro-optical (EO) radiation collector, the method comprising:
    emitting EO radiation into an EO conductor electro-optically coupled to the EO radiation collector using an EO radiation emitter, wherein the EO radiation is emitted as a coded signal;
    detecting a portion of the emitted EO radiation using an EO sensor; and
    determining a result of the self-test using the detected portion of the emitted EO radiation.

2. The method of claim 1, further comprising:
    receiving EO radiation from the EO radiation collector using the EO sensor, the received EO radiation comprising the portion of emitted EO radiation and non-emitted EO radiation,
    wherein detecting the portion of emitted EO radiation comprises distinguishing in the received EO radiation, the portion of emitted EO radiation from the non-emitted EO radiation.

3. The method of claim 2, wherein the portion of emitted EO radiation is distinguished from the non-emitted EO radiation using the coded signal.

4. The method of claim 2, further comprising detecting an arc flash event using the detected, non-emitted EO radiation.

5. The method of claim 4, wherein the EO radiation is emitted and the portion of emitted EO radiation is detected concurrently with detecting the arc flash event.

6. The method of claim 1, further comprising determining an attenuation of the detected portion of the emitted EO radiation.

7. The method of claim 6, further comprising displaying the attenuation on a human-machine interface.

8. The method of claim 6, wherein the result of the self-test operation is failure when the attenuation exceeds a threshold.

9. The method of claim 1, wherein the result of the self-test operation is failure when an intensity of the detected portion of the emitted EO radiation is less than a threshold.

10. The method of claim 1, wherein the EO radiation collector is an EO radiation point collector, wherein the emitter emits EO radiation into a first EO conductor in electro-optical communication with the EO radiation collector, and wherein the portion of the emitted EO radiation detected by the EO sensor is received via a second EO conductor in electro-optical communication with the EO radiation collector.

11. The method of claim 10, further comprising emitting EO radiation into the second EO conductor, and detecting the portion of emitted EO radiation emitted into the second EO conductor responsive to a self-test failure.

12. The method of claim 10, wherein the EO radiation collector is configured to emit EO radiation received on the first EO conductor, and wherein the EO radiation emitted from the EO radiation collector is configured to be visible by a human.

13. The method of claim 1, wherein the EO radiation collector is a loop EO radiation collector.

14. The method of claim 1, further comprising displaying the result of the self-test operation on a human-machine interface.

15. An arc flash detection device with self-test, comprising:
    an EO radiation collector comprising an EO radiation receiving area and configured to direct incident EO radiation emitted in a vicinity of the EO radiation collector into the EO radiation receiving area, the EO radiation collector configured to receive a receiving end of a first EO conductor and a receiving end of a second EO conductor, wherein the receiving ends are disposed within the EO radiation receiving area; and an EO radiation transceiver configured to emit EO radiation into the EO radiation collector and to receive from the EO radiation collector, a portion of the emitted EO radiation, and wherein the arc flash detection device determines a result of the self-test using the received portion of the emitted EO radiation.

16. The arc flash detection device of claim 15, wherein the EO radiation transceiver comprises an EO radiation emitter electro-optically coupled to the first EO conductor and an EO sensor electro-optically coupled to the second EO conductor.

17. The arc flash detection device of claim 16, wherein the EO radiation emitter comprises a light emitting diode.

18. The arc flash detection device of claim 15, wherein the EO radiation transceiver is configured to emit the EO radiation according to a coded signal.

19. The arc flash detection device of claim 18, wherein the EO radiation received from the EO radiation collector comprises the received portion of the emitted EO radiation and non-emitted EO radiation, and wherein the arc flash detection device is configured to distinguish the received portion of the emitted EO radiation from the non-emitted EO radiation.

20. The arc flash detection device of claim 19, wherein the arc flash detection device is configured to distinguish the received portion of emitted EO radiation from the non-emitted EO radiation using the coded signal.

21. The arc flash detection device of claim 19, wherein the arc flash detection device uses the non-emitted EO radiation to detect an arc flash event.

22. The arc flash detection device of claim 15, wherein the arc flash detection device detects a self-test failure if an intensity of the received portion of the emitted EO radiation is less than a threshold.

23. The arc flash detection device of claim 15, wherein the arc flash detection device is configured to determine an attenuation of the EO radiation collector using the received portion of the emitted EO radiation.

24. The arc flash detection device of claim 23, wherein the attenuation of the EO radiation collector is determined by comparing an intensity of the emitted EO radiation to an intensity of the received portion of the EO radiation.

25. The arc flash detection device of claim 15, wherein the EO radiation collector is configured to emit human visible EO radiation responsive to receiving the EO radiation emitted by the EO radiation transceiver.

26. The arc flash detection device of claim 15, wherein the first and the second EO conductors are positioned in the EO radiation collector such that longitudinal axes of the receiving ends of the first and the second EO conductors are non-parallel in the EO radiation receiving area.

27. The arc flash detection device of claim 15, wherein the EO radiation transceiver is configured to transmit the emitted EO radiation to the EO radiation collector via the first EO conductor, and wherein EO radiation transmitted to the EO radiation collector via the first EO conductor is received by the receiving end of the second EO conductor and transmitted to the EO radiation transceiver.

28. The arc flash detection device of claim 27, wherein non-parallel longitudinal axes of the receiving ends of the first and the second EO conductors are configured to provide for EO transmission between the first and the second EO conductors.

29. A computer-readable storage medium comprising instructions that if executed by a computing device cause the computing device to perform a method for providing arc flash protection with self-test, the method comprising:

emitting EO radiation into a first EO conductor in electro-optical communication with an EO radiation collector, wherein the EO radiation is emitted according to a coded signal;

receiving EO radiation, the received EO radiation comprising a received portion of the emitted EO radiation and non-emitted EO radiation;

distinguishing in the received EO radiation, the portion of the emitted EO radiation from the non-emitted EO radiation using the coded signal;

determining a result of the self-test based upon the received portion of the emitted EO radiation; and using the non-emitted EO radiation to provide for detecting an arc flash event.

* * * * *